US012655520B2

(12) United States Patent
Braun

(10) Patent No.: US 12,655,520 B2
(45) Date of Patent: Jun. 16, 2026

(54) METHOD OF COATING A COATING REGION ON A FRONT SURFACE OF A SUBSTRATE AND APPARATUS FOR A THERMAL EVAPORATION SYSTEM

(71) Applicant: MAX-PLANCK-GESELLSCHAFT ZUR FÖRDERUNG DER WISSENSCHAFTEN E.V., Munich (DE)

(72) Inventor: Wolfgang Braun, Bietigheim-Bissingen (DE)

(73) Assignee: Max-Planck-Gesellschaft zur Förderung der Wissenschaften e. V., Munich (DE)

( * ) Notice: Subject to any disclaimer, the term of this patent is extended or adjusted under 35 U.S.C. 154(b) by 0 days.

(21) Appl. No.: 18/573,621

(22) PCT Filed: Jul. 28, 2021

(86) PCT No.: PCT/EP2021/071186
§ 371 (c)(1),
(2) Date: Dec. 22, 2023

(87) PCT Pub. No.: WO2023/006197
PCT Pub. Date: Feb. 2, 2023

(65) Prior Publication Data
US 2024/0327979 A1      Oct. 3, 2024

(51) Int. Cl.
*C23C 16/448* (2006.01)
*C23C 16/458* (2006.01)
*C23C 16/48* (2006.01)
(52) U.S. Cl.
CPC ...... *C23C 16/4485* (2013.01); *C23C 16/4583* (2013.01); *C23C 16/48* (2013.01)

(58) Field of Classification Search
CPC . C23C 16/4485; C23C 16/4583; C23C 16/48; C23C 14/28; C23C 16/45514; C23C 14/0021
See application file for complete search history.

(56) References Cited

U.S. PATENT DOCUMENTS 5,618,388 A      4/1997   Seeser et al.
2005/0005846 A1*  1/2005   Selvamanickam ..... C23C 14/28
                                                                118/718
(Continued)

FOREIGN PATENT DOCUMENTS

CN        101058867 A      10/2007
DE        102018127262 A1*  4/2020   ......... C23C 14/0021
(Continued)

OTHER PUBLICATIONS

Notice of Reasons for Refusal and Translation dated Jul. 30, 2025 corresponding to Japanese Patent Application No. 2023-568198, 6 pages.

(Continued)

*Primary Examiner* — Nga Leung V Law
(74) *Attorney, Agent, or Firm* — Dickinson Wright PLLC

(57) ABSTRACT

The present invention is related to a method of coating a coating region (58) on a front surface (56) of a substrate (50) with a source material (40) thermally evaporated and/or sublimated from a source (30) by electromagnetic radiation (80). Further, the present invention is related to an apparatus (100) for a thermal evaporation system (200) for coating a coating region (58) on a front surface (56) of a substrate (50) with a source material (40) thermally evaporated and/or sublimated by electromagnetic radiation (80) from a source (30).

24 Claims, 13 Drawing Sheets

(56)     References Cited

U.S. PATENT DOCUMENTS

| 2007/0243328 A1 | 10/2007 | Liu et al. |
| 2009/0176033 A1* | 7/2009 | Gonzalez Leal ... C23C 14/0623 |
| | | 427/532 |
| 2009/0279179 A1* | 11/2009 | Tanaka ................. G02B 3/0018 |
| | | 427/595 |
| 2021/0355576 A1* | 11/2021 | Braun ..................... C23C 14/28 |

FOREIGN PATENT DOCUMENTS

| EP | 0437890 A1 | 7/1991 |
| EP | 0669411 A2 | 8/1995 |
| EP | 1990441 A1 | 11/2008 |
| EP | 2000558 A2 | 12/2008 |
| JP | H7-188907 A | 7/1995 |
| JP | 2001-357739 A | 12/2001 |
| JP | 2007-288141 A | 11/2007 |
| WO | 2020/089180 A2 | 5/2020 |

OTHER PUBLICATIONS

Examination Report and Translation dated Nov. 5, 2025 corresponding to Taiwanese Patent Application No. 111127790, 49 pages.

* cited by examiner

State of the art

*A*

*B*

METHOD OF COATING A COATING REGION ON A FRONT SURFACE OF A SUBSTRATE AND APPARATUS FOR A THERMAL EVAPORATION SYSTEM

CROSS-REFERENCES TO RELATED APPLICATIONS

This application is a 371 National Phase Application of International Application PCT/EP2021/071186, filed on Jul. 28, 2021. The entire disclosure of the application referenced above is incorporated herein by reference.

The invention is related to a method of coating a coating region on a front surface of a substrate with a source material thermally evaporated and/or sublimated from a source by electromagnetic radiation, whereby the source comprises one or more source sections consisting of the source material, whereby the substrate and the source are arranged within a reaction chamber containing a reaction atmosphere, whereby the electromagnetic radiation is provided as one or more incident radiation beams and coupled into the reaction chamber through a chamber window of the reaction chamber such that the one or more incident radiation beams and a normal to the surface of the source include an incident angle larger than 0° and smaller than 90° and thereby form a radiation plane. In addition, the present invention is related to an apparatus for coating a coating region on a front surface of a substrate with a source material thermally evaporated and/or sublimated by electromagnetic radiation from a source, the apparatus comprising a source arrangement for arranging the source comprising one or more source sections consisting of the source material and a substrate arrangement for arranging the substrate, whereby the source arrangement and the substrate arrangement are arranged within the reaction chamber of the apparatus fillable with a reaction atmosphere, the reaction chamber further comprising a chamber window for coupling the electromagnetic radiation provided as one or more incident radiation beams into the reaction chamber such that the one or more incident radiation beams and a normal to the surface of the source include an incident angle larger 0° and smaller 90° and thereby form a radiation plane.

Figure 1:
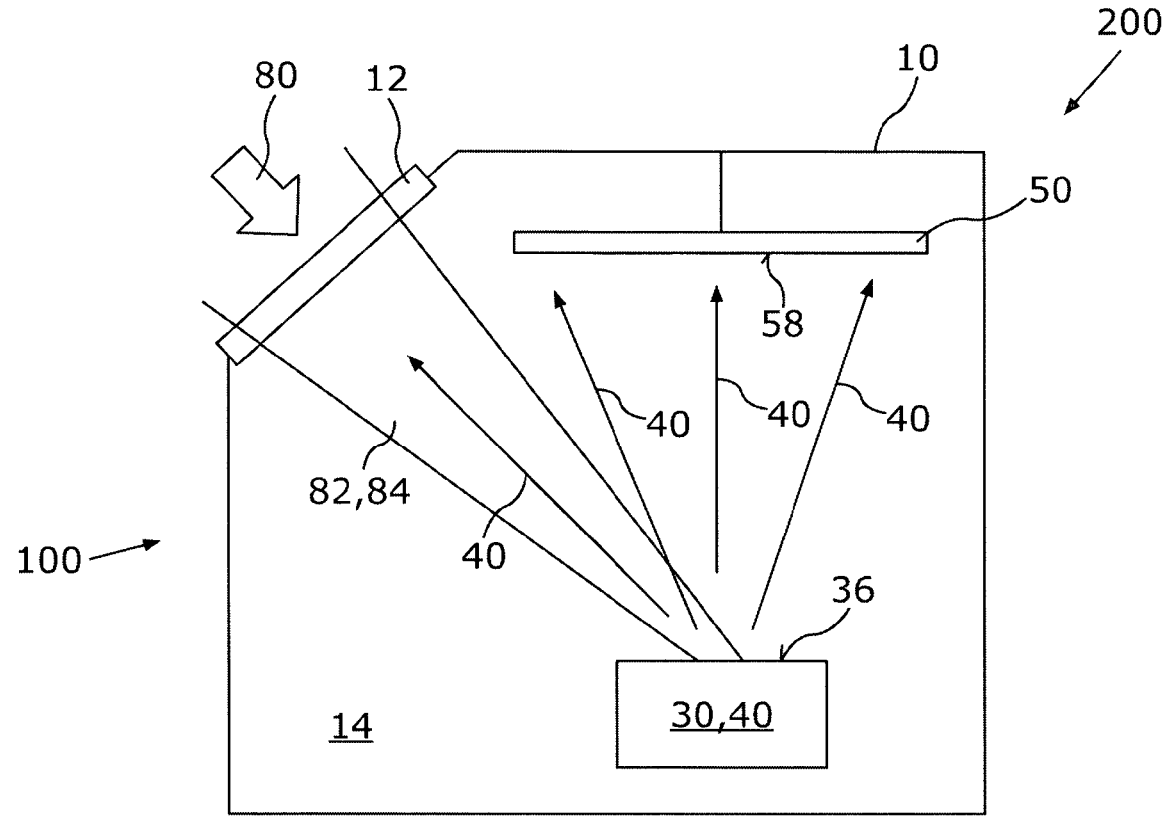

In FIG. 1, a simplified thermal evaporation system 200 according to the state of the art is depicted. The system 200 is based on sublimating and/or evaporating source material 40 by impinging electromagnetic radiation 80 on a source 30 providing a source material 40. In particular in thermal laser evaporation systems 200, laser light 80 is used for evaporating and/or sublimating source material 40 for coating a coating region 58 on a substrate 50. The source 30 and the substrate 50 are arranged within a reaction chamber 10 of an apparatus 100, which additionally can be filled with a reaction atmosphere 14.

In such systems 200 laser light 80, or in general any electromagnetic radiation 80 suitable for evaporating and/or sublimating the source material 40, is coupled into the reaction chamber 10 through a chamber window 12 of the reaction chamber 10. In particular, in systems 200 according to the state of the art, a direct line of sight between the chamber window 12 and the source 30 is designed for the evaporation and/or sublimation of the source material 40 by the incident radiation beam 82.

However, as indicated in FIG. 1 by arrows marking the flow of evaporated and/or sublimated source material 40, source material 40 is not only deposited in the coating region 58 of the substrate 50, but also onto the camber window 12. In other words, the chamber window 12 is exposed to the evaporation and/or sublimation flux, leading to a coverage of the chamber window 12. In addition, in particular when requiring the deposition on large coating regions 58 substrates, there is a spatial competition between the chamber window 12 and the substrate 50. Either the laser beam 80 needs to impinge at an angle almost grazing to the source 30, which leads to unstable operation once the source surface 36 deviates from a perfect horizontal shape, or the substrate 50 needs to move far away from the source 30, requiring very high local flux densities at the source surface 36. The combination of a large substrate 50 in close proximity to the source 30, ideal in terms of material utilization, is therefore difficult to achieve.

In view of the above, it is an object of the present invention to provide an improved method of coating a coating region on a front surface of a substrate and an improved apparatus for coating a coating region on a front surface of a substrate which do not have the aforementioned drawbacks of the state-of-the-art. In particular it is an object of the present invention to provide an improved method of coating a coating region on a front surface of a substrate and an improved apparatus for coating a coating region on a front surface of a substrate which allow shielding of the chamber window against evaporated and/or sublimated source material and simultaneously minimizing and/or optimizing a distance between the source surface and the coating region on the substrate, without the requirement of an almost grazing impingement of the electromagnetic radiation onto the source.

This object is satisfied by the respective independent patent claims. In particular, this object is satisfied by a method of coating a coating region on a front surface of a substrate according to claim 1. The dependent claims describe preferred embodiments of the invention. Details and advantages described with respect to a method of coating a coating region according to the first aspect of the invention also refer to an apparatus for coating a coating region according to the second aspect of the invention and vice versa, if of technical sense.

According to the first aspect of the invention, the object is satisfied by a method of coating a coating region on a front surface of a substrate with a source material thermally evaporated and/or sublimated from a source by electromagnetic radiation, whereby the source comprises one or more source sections consisting of the source material, whereby the substrate and the source are arranged within a reaction chamber containing a reaction atmosphere, whereby the electromagnetic radiation is provided as one or more incident radiation beams and coupled into the reaction chamber through a chamber window of the reaction chamber such that the one or more incident radiation beams and a normal to the surface of the source include an incident angle larger than 0° and smaller than 90° and thereby form a radiation plane. The method according to the present invention comprises the steps of:

a) Providing the substrate with a substrate material transparent or at least essentially transparent to the electromagnetic radiation, b) Arranging the substrate within the reaction chamber between the chamber window and the source, whereby the front surface of the substrate faces the source and a back surface of the substrate faces the chamber window, c) Illuminating the source with the one or more incident radiation beams through the substrate during the coating process.

The method according to the present invention is intended to be preferably carried out in and with a system for coating a coating region of a substrate, respectively. The source material to be deposited is evaporated and/or sublimated by electromagnetic radiation impinging on the source material, which forms the one or more source sections of the source. Each one of the one or more source sections consist of a single source material. However, if two or more source sections are present in the source, the source materials of the different source sections can be identical or different.

The source and the substrate carrying the coating region are arranged within a reaction chamber containing a reaction atmosphere. Preferably, a distance between the source and the coating region on the substrate are optimized for the coating to be achieved. The reaction atmosphere according to the present invention can be a vacuum between $10^{-4}$ and $10^{-12}$ hPa, for pure ideal conditions $10^{-8}$ hPa to $10^{-12}$ hPa, or can comprise or consist of one or more reaction gases such as for instance molecular oxygen, ozone, molecular hydrogen or molecular nitrogen, with a pressure of $10^{-8}$ hPa to ambient pressure, respectively up to 1 hPa. In the latter case, the reaction gases can preferably be chosen according to the composition of the coating. The oxygen variants $O_2$ and $O_3$ are can preferably be provided in a ratio of approximately 9:1 as produced by an inline glow discharge ozone generator. Further, the reaction gas can be at least ionized, in particular ionized by plasma ionization.

The electromagnetic radiation is provided as one or more incident radiation beams and coupled into the reaction chamber through the camber window. It impinges onto the surface and includes together with a normal to the surface of the source an incident angle larger than 0° and smaller than 90°. Hence, a very small incident angle close to 0° indicates an incident radiation beam impinging almost perpendicularly onto the source surface, a very large incident angle close to 90° indicates an incident radiation beam at grazing angle to the source surface.

According to the first step a) of the method according to first aspect of the present invention the substrate is provided with a substrate material transparent or at least essentially transparent to the electromagnetic radiation. Transparent or at least substantially transparent in the sense of the present invention means in particular that the transmitted electromagnetic radiation undergoes an attenuation of less than 10%, preferably less than 1%. In other words, the electromagnetic radiation can shine through the substrate without any severe attenuation. For this, the substrate material is accordingly chosen with respect to the used electromagnetic radiation, in particular with respect to the wavelength of the used electromagnetic radiation.

Providing the substrate transparent or at least essentially transparent to the electromagnetic radiation allows in the following step b) of the method according to the first aspect of the present invention to arrange the substrate within the reaction chamber between the chamber window and the source. Hence, during the coating process in step c) of the method according to the first aspect of the present invention, the electromagnetic radiation enters the reaction chamber through the chamber window, impinges and shines through the substrate and only afterwards impinges onto and illuminates the target.

In other words, the source surface is not masked up with the transparent or at least essentially transparent substrate with respect to the electromagnetic radiation. Hence the position of both the chamber window and the substrate, respectively, can be chosen without the constraint of a necessity of a direct and unobstructed line-of-sight between the chamber window and the surface of the source.

The evaporation and/or sublimation flux of source material evaporated and/or sublimated by the impinging electromagnetic radiation travels away from the surface of the source, in particular for example from a flat surface obeying a cosine distribution. Accordingly, in step b) the substrate is arranged in the reaction chamber such that the front surface of the substrate carrying the coating region faces the source for enabling the desired coating of the coating region.

However, as already mentioned above with respect to FIG. 1, evaporated and/or sublimated source material not only travels towards the desired coating region. Nevertheless, the evaporated and/or sublimated source material generally travels along a straight line. By arranging the substrate in step b) such that in step c) the electromagnetic radiation shines through the substrate during the illumination process of the source and hence in the direct line-of-sight between the chamber window and the source, the evaporated and/or sublimated source material is deposited onto the substrate. In particular, a deposition of evaporated and/or sublimated source material onto the chamber window can be prohibited or at least drastically reduced. As a deposition of evaporated and/or sublimated source material onto the chamber window has a crucial impact onto the service life of the evaporation system as a whole, said service life can be drastically prolonged. Preferably, a replacement of the chamber window due to coating with the evaporated and/or sublimated source material can be completely avoided.

Preferably, the method according to the first aspect of the present invention can be characterized in that laser light, in particular laser light with a wavelength between 10 nm to 100 μm, preferably with a wavelength selected in the infrared range, especially with a wavelength of 1 μm, is used as electromagnetic radiation. Laser light comprises the advantage that it is coherent and can be provided over a wide range of wavelengths and intensities. For each specific source material to be evaporated and/or sublimated, an appropriate laser light can be chosen. The laser light can be provided in pulses, or more preferably in a continuous way. A very homogeneous evaporation and/or sublimation, in particular below the plasma threshold of the specific source material, can thereby be provided.

In addition, the method according to the first aspect of the present invention can comprise that the one or more incident radiation beams are focused towards the source such that a median intersection area of the one or more incident radiation beams with the substrate is larger than an intersection area of the one or more incident radiation beams and the surface of the source. In other words, the spatial energy density of the impinging electromagnetic radiation on the surface of the source is larger than the respective spatial energy density at and within the substrate. Even if the substrate is essentially transparent to the electromagnetic radiation, a small fraction of the energy of the radiation beam may nevertheless be absorbed by the substrate. By reducing the spatial energy density, a risk of harming the substrate by absorbed electromagnetic radiation can be lowered further. Simultaneously, providing a small intersection area of the one or more incident radiation beams and the surface of the source ensures a high energy density at this position and hence the evaporation and/or sublimation of the source material.

In particular, the method according to the first aspect of the present invention can be improved by that a focal point or a focal volume of the focused one or more incident radiation beams is arranged at the surface of the source.

Hence, the aforementioned spatial energy density of the impinging electromagnetic radiation is maximized at the surface of the target. As a result, the evaporation and/or sublimation process of source material is improved. In the scope of the present invention, the focal volume is the smallest volume of the electromagnetic radiation per unit length along its propagation, whereby the focal point is the special and ideal case of a point-like focal volume.

Further, the method according to the first aspect of the present invention can be characterized in that the coating region is at least on average arranged in a plane perpendicular to the radiation plane. As described above, the radiation plane is defined as including the incident radiation beam and the normal to the surface of the source. In other words, a coating region perpendicular to the radiation plane ensures that, with respect to the surface of the source, the coating region is arranged in a plane symmetric to the radiation plane. Hence evaporated and/or sublimated source material is reaching the coating region on both sides of the radiation plane with the same spatial and angular distribution. A uniform deposition of evaporated and/or sublimated source material onto the coating region can thereby be reached or at least be improved.

In a further improvement, the method according to the first aspect of the present invention can comprise that at least the coating region of the substrate, in particular the entire substrate, is planar. In other words, the coating region completely falls in the above-mentioned plane perpendicular to the radiation plane. Planning the deposition of evaporated and/or sublimated material onto the coating region can thereby the rendered more easily. In addition, shadowing of parts of the coating region by other parts of the coating region of the substrate as a whole can be prohibited. Further, moving the substrate, as described later, can be provided more easily with a planar coating region or a planar substrate.

Also, the method according to the first aspect of the present invention can be characterized in that the one or more incident radiation beams and the surface normal to the source include an incident angle between 20° and 70°, preferably an incident angle between 35° and 55°. The lower the incident angle, the lower is a danger of an unstable operation once the source surface deviates from a perfect horizontal shape. The higher the incident angle, the lower is the probability of an overlap of the intersection area of the incident radiation beam and the substrate and the coating region, which may result in a disturbance of the coating at the coating region. An incident angle between 20° and 70°, preferably an incident angle between 35° and 55° provides a good compromise between these two constraints.

In addition, the method according to the first aspect of the present invention can comprise that the one or more incident radiation beams are reflected on the surface of the one or more source sections back in one or more reflected radiation beams, in particular onto the front surface of the substrate, whereby the one or more reflected radiation beams falls into the radiation plane. In other words, the incident electromagnetic radiation is coupled into the reaction chamber, shines through the substrate, impinges onto the surface of the source for the evaporation and/or sublimation of the source material, and is in this connection reflected on the surface of the source back onto the substrate, in particular onto the front surface of the substrate. Preferably for some embodiments, the reflected radiation beam can impinge onto the front surface of the substrate at a position at least partly coated by the evaporated and/or sublimated source material. This can be provided for instance by arranging the substrate such that the reflected radiation beam hits the substrate at least partly at the coating region, however preferably by moving the substrate relative to the source during the coating process, as described later.

As the electromagnetic radiation is particularly chosen for evaporating and/or sublimating the source material, in most of the cases the source material absorbs the electromagnetic radiation significantly better than the transparent or at least essentially transparent substrate. Hence the coating on the front surface of the substrate gets reheated by the reflected radiation beam and thereby annealing processes can be performed. An overall quality of the coating can thereby be enhanced.

In an enhanced embodiment of the method according to the first aspect of the present invention, the substrate is tilted with respect to the source at a tilting angle larger than 0° around a tilting axis perpendicular to the radiation plane, whereby the tilting angle is included between a normal at the center of the coating region and a line connecting the center of the surface of the source with the center of the coating region, whereby the included tilting angle is chosen such that a distance of a median intersection area of the one or more incident radiation beams with the substrate and the source is larger than a distance of a median intersection area of the one or more reflected radiation beams with the substrate and the source.

As mentioned before, the impinging radiation beam is focused towards the surface of the source, Thereby the reflected radiation beam also comprises its focal point or volume, respectively, at the surface of the source and diverges along its propagation away from the surface of the source towards the front surface of the substrate.

Hence, as the reflection of the electromagnetic radiation on the surface of the source as a first approximation preserves the focal alignment of the incident radiation beam in the reflected radiation beam, in this embodiment the median intersection area of the incident radiation beam and the substrate is larger than the median intersection area of the reflected radiation beam and the substrate. As mentioned above, a larger intersection area results in a smaller energy density of the respective radiation beam and vice versa. Thereby the energy density of the impinging radiation beam and reflected radiation beam, respectively, can easily be adjusted according to the requirements of the actual coating. In the embodiment described above, the energy density at the intersection area of the reflected beam and the substrate is increased by the tilting of the substrate. This can be for instance of advantage, if performing annealing processes is favorable but need a certain energy density of the reflected radiation beam achievable by decreasing the distance between the source surface and the intersection area of the reflected radiation beam and the substrate.

According to an alternative embodiment, the method according to the first aspect of the present invention can be enhanced by that the substrate is tilted with respect to the source at a tilting angle larger than 0° around a tilting axis perpendicular to the radiation plane, whereby the tilting angle is included between a normal at the center of the coating region and a line connecting the center of the surface of the source with the center of the coating region, whereby the included tilting angle is chosen such that a distance of a median intersection area of the one or more incident radiation beams with the substrate and the source is smaller than a distance of a median intersection area of the one or more reflected radiation beams with the substrate and the source.

In this alternative embodiment, the tilting of the substrate is provided opposite to the embodiment described above.

However, all details and advantages described with respect to the embodiment above are still valid, however considered the tilt of the substrate in the opposite direction.

In particular, in this embodiment the median intersection area of the incident radiation beam and the substrate is smaller than the median intersection area of the reflected radiation beam and the substrate. Again, a smaller intersection area results in a higher energy density of the respective radiation beam and vice versa. Thereby the energy density of the impinging radiation beam and reflected radiation beam, respectively, can easily be adjusted according to the requirements of the actual coating. In the present embodiment, the energy density at the intersection area of the reflected beam and the substrate is decreased by the tilting of the substrate. This can be for instance of advantage, if the energy density of the reflected beam would be too high, for instance as high as to again causing evaporation and/or sublimation processes of the source material deposited onto the coating region on the front surface of the substrate. Negative effects of the reflected radiation beam impinging onto the deposited source material on the front surface of the substrate can thereby be avoided. However, the tilting angle can be chosen such that annealing processes can still be performed.

Preferably, the method according to the first aspect of the present invention can be further enhanced by that the tilting angle of the substrate is chosen for adjusting an energy density of the one or more reflected radiation beams at the front surface of the substrate. As mentioned above, the energy density of the reflected radiation beam at the front surface of the substrate depends on the focal properties of the radiation beam and in particular on the distance of the reflecting surface of the source and the intersection area of the reflected radiation beam and the substrate. Hence, by actively adjusting the tilting angle, the value of the latter can be changed easily. This renders possible on the one hand a general adjustment of the energy density, based on a given focal property of the radiation beam, and on the other hand also actively controlling the energy density based on changes of said focal properties, in particular by a closed loop control.

As mentioned above, the back reflection of the incident radiation beam onto the front surface of the substrate is of advantage for some of the coating processes which can be provided by the method according to the first aspect of the present invention. However, also the opposite is possible, namely that the reflected radiation beam would harm the coating of already coated areas of the substrate.

For this case, the method according to the first aspect of the present invention can be enhanced by that the substrate is tilted with respect to the source at a tilting angle larger than 0° around a tilting axis perpendicular to the radiation plane, whereby the tilting angle is included between a normal at the center of the coating region and a line connecting the center of the surface of the source with the center of the coating region, whereby the included tilting angle is chosen such that the one or more reflected radiation beams miss the front surface of the substrate. With this arrangement of the substrate, in particular by the accordingly chosen tilting angle of the substrate, impinging of the reflected radiation beams onto the front surface can be prohibited. Damaging effects for the coating of the substrate caused by the reflected radiation beam can thereby be avoided.

Additionally, or alternatively, the method according to the first aspect of the present invention can also be enhanced by that an absorber element is arranged between the surface of the one or more source sections and the front surface of the substrate such that the one or more reflected radiation beams impinge onto the absorber element and are absorbed by the absorber element.

In some embodiments, spatial constraints and/or features of the substrate itself prohibit the aforementioned tilting of the substrate away from the reflected radiation beam. In these cases, an absorber element suitably positioned in the path of the reflected radiation beam can be used for absorbing the reflected radiation beam and hence for preventing any damaging effects to the coating of the substrate caused by the reflected radiation beam. However, said absorber element can also be used in addition to the aforementioned tilting of the substrate.

According to an especially preferred embodiment of the method according to the first aspect of the present invention, the substrate is moved during the coating process for rearranging the substrate with respect to the position of the coating region on the front surface of the substrate, whereby a distance between the source and the coating region is kept constant or at least essentially constant. In other words, in this embodiment a successive coating of a large area on the front surface of the substrate can be provided. By keeping the distance between the source and the coating region constant or at least essentially constant, a continuous coating with stationary or at least essentially stationary conditions can be provided. Alternatively, or in addition, as a result the homogeneity of the coating may be improved.

In combination with the embodiments described above comprising a reflected radiation beam impinging onto already coated regions of the front surface of the substrate, also these already coated areas are moved. The above-mentioned annealing processes can thereby be performed continuously in new and not yet annealed regions.

Further, the method according to the first aspect of the present invention can be enhanced by that the substrate is moved in at least one of the following ways:

linearly circularly helically meanderingly.

This list is not closed and also other ways of moving the substrate are possible. By choosing the most appropriate way of moving the substrate, a wide variety of possible coating patterns can be provided.

In addition, the method according to the first aspect of the present invention can comprise that the substrate is at least on average moved along an intersection line of the substrate and the radiation plane. In particular with a planar substrate, the substrate moves at least on average linearly along the intersection line. The above-mentioned embodiments with a reflected radiation beam and in particular the advantageous effects provided by such a reflected radiation beam, for instance performing annealing processes in already coated areas on the substrate, can thereby be implemented more easily.

In another embodiment of the method according to the first aspect of the present invention, the substrate is subdivided into two or more substrate segments, whereby the two substrate segments are arranged back to back, in particular connected by a substrate connector, and moved together during the coating process. By this, coating regions on two or more separate substrate segments can subsequently be coated in a single coating session, preferably without a necessity to open the reaction chamber in between. An operational capacity of the method according to the first aspect of the present invention can thereby be increased.

The two or more substrate segments can be held available within the reaction chamber. Additionally, or alternatively, also a suitable air lock can be arranged in the chamber wall of the reaction chamber, for instance providing a separately pumpable load lock chamber and/or differential pumping, for subsequently supplying the two or more substrate segments for the intended coating.

Further, the method according to the first aspect of the present invention can comprise that in step c) an intensity of the one or more incident radiation beams is increased during an illumination of the substrate connector by parts of the one or more incident radiation beams if the substrate connector is less transparent than the substrate material of the adjacent substrate segments with respect to the electromagnetic radiation. As mentioned above, the incident radiation beam comprises a certain size when shining through the substrate, described by the intersection area of the one or more incident radiation beams with the substrate. In most of the applications of the method according to the first aspect of the present invention, said intersection area will be larger than the size of the substrate connector. Hence, if the substrate connector is less transparent than the substrate segments, the incident radiation beam impinging onto the source is partly shadowed by the substrate connector. By increasing the intensity of the one or more incident radiation beams in step c) of the method according to the present invention, this shadowing effect can be compensated. An undisturbed, continuous and even evaporation and/or sublimation of the source material can thereby be provided.

Alternatively, or additionally the method according to the first aspect of the present invention can be enhanced by that in step c) an intensity of the one or more incident radiation beams is reduced during an illumination of the substrate connector by parts of the one or more incident radiation beams if the substrate connector is more transparent than the substrate material of the adjacent substrate segments with respect to the electromagnetic radiation. In contrast to the embodiment described in the last paragraph, the substrate connector now comprises a transparency with respect to the incident radiation beam which is higher than the transparency of the adjacent substrate segments. Hence the incident radiation beam impinging onto the source is partly enhanced when the intersection area of the incident radiation beam and the substrate encompasses the substrate connector. By reducing the intensity of the one or more incident radiation beams, this enhancing effect can be compensated. An undisturbed, continuous and even evaporation and/or sublimation of the source material can thereby be provided.

Further, the method according to the first aspect of the present invention can comprise that the velocity of the movement of the substrate is reduced during an illumination of the substrate connector by parts of the one or more incident radiation beams if the substrate connector is less transparent than the substrate material of the adjacent substrate segments with respect to the electromagnetic radiation. Alternatively, or additionally, to increasing the intensity of the one or more incident radiation beams, Also by reducing the velocity of the movement of the substrate, namely the two or more substrate segments connected back to back by the substrate connector, the aforementioned shadowing effect of the substrate connector can be compensated. An undisturbed, continuous and even evaporation and/or sublimation of the source material can thereby be provided.

Alternatively, or additionally, the method according to the first aspect of the present invention can be enhanced by that the velocity of the movement of the substrate is increased during an illumination of the substrate connector by parts of the one or more incident radiation beams if the substrate connector is more transparent than the substrate material of the adjacent substrate segments with respect to the electromagnetic radiation. In the opposite case to the embodiment described in the previous paragraph, namely of a substrate connector with a higher transparency than the substrate material, increasing the velocity of the movement of the substrate, namely the two or more substrate segments connected back to back by the substrate connector, can compensate the enhancing effect caused by a substrate connector which is more transparent to the electromagnetic radiation than the material of the substrate, in particular again alternatively, or additionally, to reducing the intensity of the one or more incident radiation beams. An undisturbed, continuous and even evaporation and/or sublimation of the source material can thereby be provided.

According to a further alternative embodiment the method according to the first aspect of the present invention can comprise that the substrate is moved at constant velocity. Moving the substrate at a constant velocity is mechanically simple and can be easily provided. The complexity of an apparatus for carrying out the method according to the first aspect of the present invention can thereby be reduced.

In addition, the method according to the first aspect of the present invention can comprise that the substrate is provided as a flexible foil supported by support elements, in particular cylindrical rollers, within the reaction chamber, whereby the foil is moved during the coating process from a supply roll to a product roll, the supply roll and/or the product roll preferably arranged outside of the reaction chamber. For embodiments with at least one of the rolls outside of the reaction chamber suitable air locks are preferably provided in the chamber wall of the reaction chamber.

In other words, the flexible foil provided as substrate is unwound from the supply roll, moved past the coating region, and then rewound onto the product roll again. Support elements within the reaction chamber ensure that the flexible foil stays on track, whereby in particular the support elements can also comprise one or more devices for tensioning the foil. At the coating region, the flexible foil can be provided straight and/or bend according to the requirements of the actual coating process. Also, a cooling of the foil is possible, for instance by actively cooled support elements or designated cooling elements arranged in the vicinity of the foil, the cooling element preferably comprising cooling surfaces which are arranged parallel to the foil.

In summary, a flexible foil used as substrate in the method according to the present invention allows to significantly increase the dimensions of the substrate, in particular along the moving direction. In embodiments of the coating process provided by the present invention, in which the supply roll and the product roll are arranged outside of the reaction chamber, even an exchange of run out supply rolls and completely filled product rolls is possible. Solely with regard to the substrate supply, an infinite coating process can be provided.

Further, the method according to the first aspect of the present invention can be characterized in that the source comprises two or more, in particular disjunct, source sections, each one of the source sections consisting of the source material. As mentioned above, the spatial characteristic of the evaporation and/or sublimation mostly obeys a cosine distribution, in particular for sources with flat surfaces. By comprising two or more source sections, whereby each one of the source sections is illuminated by the one or more incident radiation beams, the evaporated and/or sublimated source materials of the two or more individual source sections can merge and hence the deposition of the source material onto the coating region on the front surface of the substrate can be more uniform, it can be accelerated and/or the size of the said coating region can be enlarged and/or the shape of said coating region can be altered. In particular, the spatial homogeneity of the deposition flux, resulting in a thickness variation of the deposited film, can be minimized.

According to a further embodiment of the method according to the first aspect of the present invention, the source materials of two or more of the source sections are different.

In addition, the method according to the first aspect of the present invention can also comprise that one or more of the source sections comprises a source shape such that an extension of the source shape perpendicular to the radiation plane is larger than an extension of the source shape parallel to the radiation plane. In other words, as said source section is illuminated, in particular completely illuminated, by the incident radiation beam, also the spatial distribution of the source material evaporated and/or sublimated of said source segment comprises a larger extent perpendicular to the radiation plane than parallel to the radiation plane. The advantage of an alteration of the shape of the spatial distribution of the evaporated and/or sublimated source material mentioned above with respect to a source comprising two or more source segments can thereby be provided by a single source segment. In particular for a substrate moved during the coating process, a larger extent and an improved thickness uniformity of the coating region perpendicular to the radiation plane, and hence automatically perpendicular to the movement direction of the substrate, can therefore be provided. Preferably, this leads to an increased spatial uniformity of the deposited layer on the substrate.

Further, the method according to the first aspect of the present invention can be characterized in that the one or more incident radiation beams comprise a beam shape such that an extension of the beam shape perpendicular to the radiation plane is larger than an extension of the beam shape parallel to the radiation plane. In particular in combination with a source comprising accordingly arranged two or more source sections and/or a single source section with a source shape enlarged perpendicular to the radiation plane, an illumination of the source as a whole with the incident radiation beam can be provided more easily. In particular, the one or more incident radiation beams can comprise a beam with an extension perpendicular to the radiation plane such that it can evaporate and/or sublimate source material for a deposition across the entire width of the coating area. Preferably, this leads to an increased spatial uniformity of the deposited layer on the substrate.

Additionally, or alternatively, the method according to the first aspect of the present invention can comprise that the one or more incident radiation beams comprise a beam shape such that an extension of the beam shape perpendicular to the radiation plane is smaller than an extension of the beam shape parallel to the radiation plane. In other words, in contrast to the embodiment described in the preceding paragraph, only a small part of the possible width of the coating region is covered by the intersection area of said one or more incident radiation beams comprising a beam shape with a small extension of the beam shape perpendicular to the radiation plane. In many applications, such as for instance solar cells, the final device has non-active areas such as contact stripes. By providing the incident radiation beam, and by that also the reflected radiation beam, with the aforementioned beam shape, it is possible to localize the intersection areas at these regions not used by the functional film deposited onto the coating region.

According to another embodiment of the method according to the first aspect of the present invention, the electromagnetic radiation is provided as two or more incident radiation beams, whereby each one of the two or more incident radiation beams illuminates the source through the substrate during the coating process. In particular, this allows to provide electromagnetic radiation simultaneously focused onto two or more focal points or volumes at the source, each focal point or volume comprised by one of the two or more incident radiation beams. With a single source section, a larger area of the surface of said single source section can be used for evaporation and/or sublimation of the source material, especially advantageous for a source section with an elongated shape. In addition, with a source comprising two or more source sections, for each one of the two or more source sections one or more of the two or more incident radiation beams can be assigned. In particular, if the two or more source sections comprise different source materials, the incident radiation beam assigned to the specific source section can be adaptively chosen for the respective source material, for instance with respect to wavelength and/or intensity.

According to the second aspect of the invention, the object can be satisfied by an apparatus for a thermal evaporation system for coating a coating region on a front surface of a substrate with a source material thermally evaporated and/or sublimated by electromagnetic radiation from a source, the apparatus comprising a source arrangement for arranging the source comprising one or more source sections consisting of the source material and a substrate arrangement for arranging the substrate, whereby the source arrangement and the substrate arrangement are arranged within a reaction chamber of the apparatus fillable with a reaction atmosphere, the reaction chamber further comprising a chamber window for coupling the electromagnetic radiation provided as one or more incident radiation beams into the reaction chamber such that the one or more incident radiation beams and a normal to the surface of the source include an incident angle larger $0°$ and smaller $90°$ and thereby form a radiation plane. The apparatus according to the second aspect of the present invention is characterized in that the substrate arrangement comprises a substrate holder for arranging the substrate between the chamber window and the source.

The apparatus according to the second aspect of the invention is intended for a usage as part of a thermal evaporation system for coating a coating region of a substrate. The source material to be deposited is thermally evaporated and/or sublimated by electromagnetic radiation impinging on the source material, which forms the one or more source sections of the source. Other parts of said thermal evaporation systems can be for instance a radiation source for providing the one or more incident radiation beams and a means for providing the reaction atmosphere such as vacuum pumps and/or supply systems for reaction gases.

By said means, the source and the substrate can be arranged within a reaction chamber which is fillable with a reaction atmosphere. The reaction atmosphere can be a vacuum between $10^{-4}$ and $10^{-12}$ hPa, for pure ideal conditions $10^{-8}$ hPa to $10^{-12}$ hPa, or can comprise or consist of one or more reaction gases such as for instance molecular oxygen, ozone, molecular hydrogen or molecular nitrogen, with a pressure of $10^{-8}$ hPa to ambient pressure, respectively up to 1 hPa. In the latter case, the reaction gases can preferably be chosen according to the composition of the coating. The oxygen variants $O_2$ and $O_3$ are can preferably be provided in a ratio of approximately 9:1 as produced by an inline glow discharge ozone generator. Further, the reaction gas can be at least ionized, in particular ionized by plasma ionization.

For arranging the source and the substrate carrying the coating region, respectively, the apparatus according to the second aspect of the present invention comprises suitable means, namely a substrate arrangement and a source arrangement, respectively. Preferably, a distance between the source and the coating region on the substrate are optimized for the coating to be achieved.

The electromagnetic radiation is provided as one or more incident radiation beams, in particular as laser beams, by a radiation source. For coupling the one or more incident radiation beams into the reaction chamber, the reaction chamber comprises one or more chamber windows.

The incident radiation beam impinges onto the surface of the source and includes together with a normal to the surface of the source an incident angle larger than 0° and smaller than 90°. Hence, a very small incident angle close to 0° indicates an incident radiation beam impinging almost perpendicularly onto the source, a very large incident angle close to 90° indicates an incident radiation beam at grazing angle to the source.

According to the invention, the substrate holder of the substrate arrangement arranges the substrate between the chamber window and the source and hence in the path of the one or more incident radiation beams. Preferably, a transparent substrate is used for avoiding masking the source by the substrate.

By arranging the substrate in the direct line-of-sight between the chamber window and the source, the evaporated and/or sublimated source material traveling in a direction towards the chamber window is deposited onto the substrate. By that, a deposition of evaporated and/or sublimated source material onto the chamber window can be prohibited or at least drastically reduced. As a deposition of evaporated and/or sublimated source material onto the chamber window has a crucial impact onto the service life of the evaporation system as a whole, said service life can be drastically prolonged. Preferably, a replacement of the chamber window due to coating with the evaporated and/or sublimated source material can be completely prohibited.

Preferably, the apparatus according to the second aspect of the present invention can comprise that the apparatus is configured to carry out a method according to the first aspect of the present invention. Hence the apparatus according to the second aspect of the present invention provides all advantages described above with respect to the method according to the first aspect of the present invention.

Figure 2:
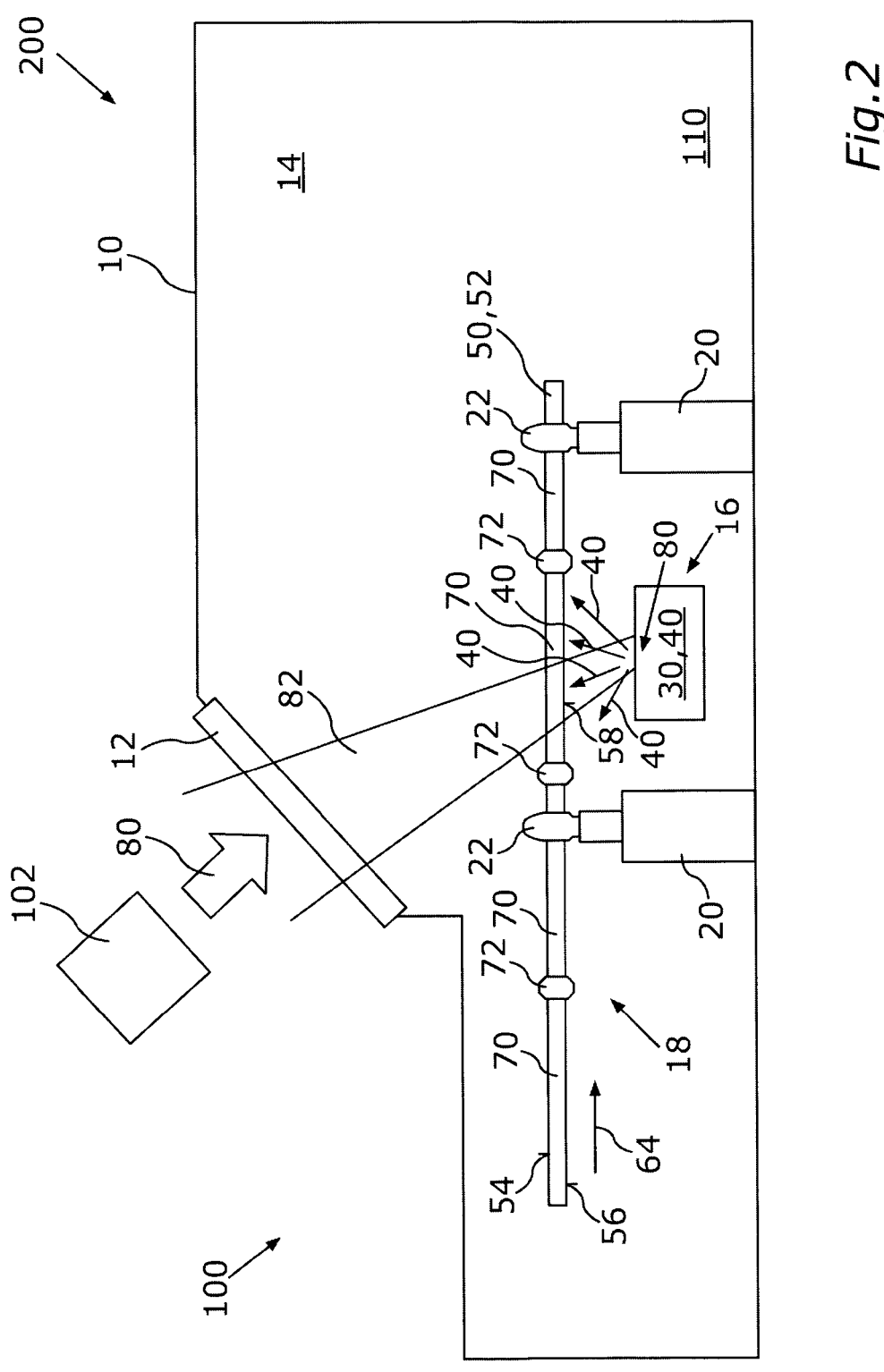
Figure 3:
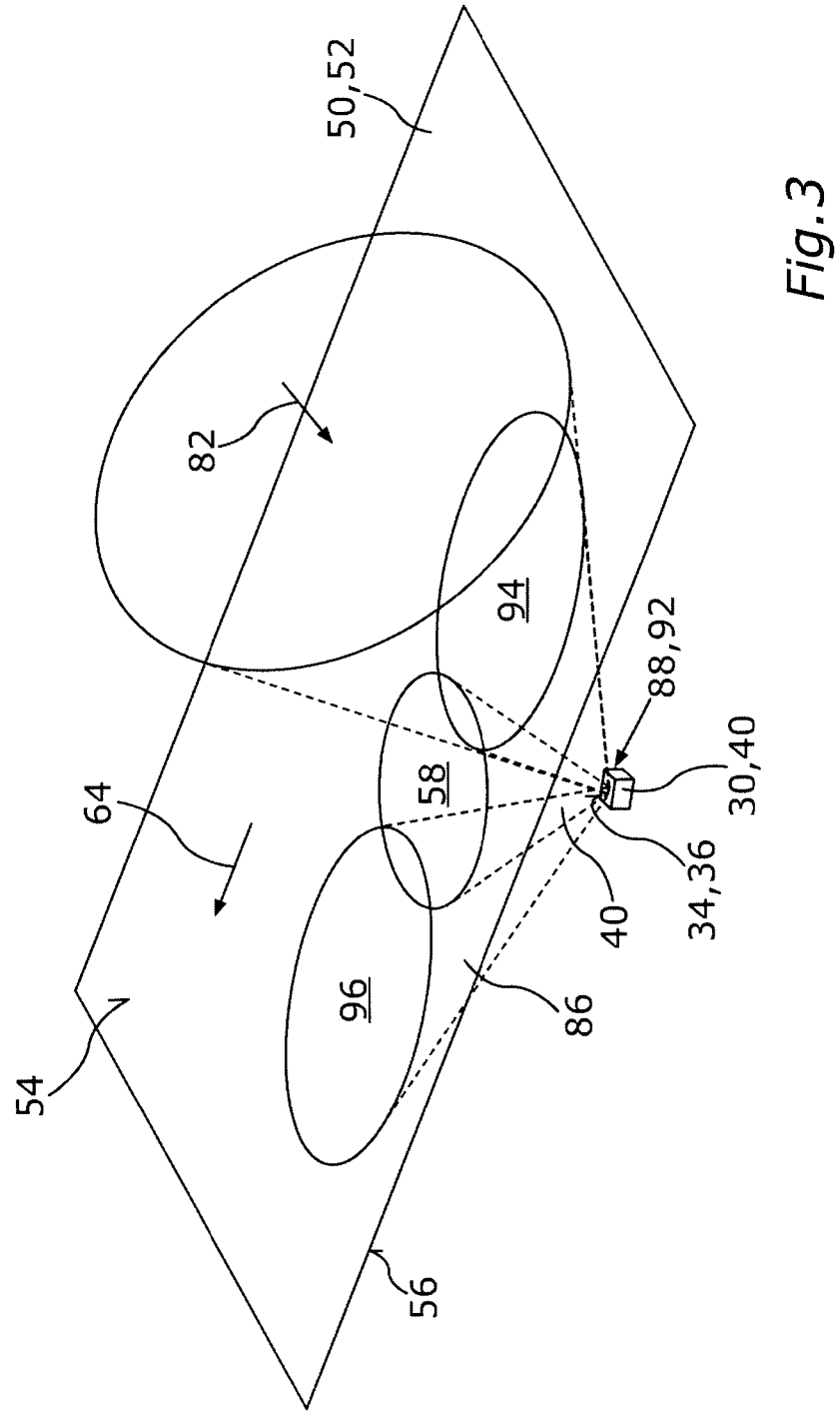
Figure 4:
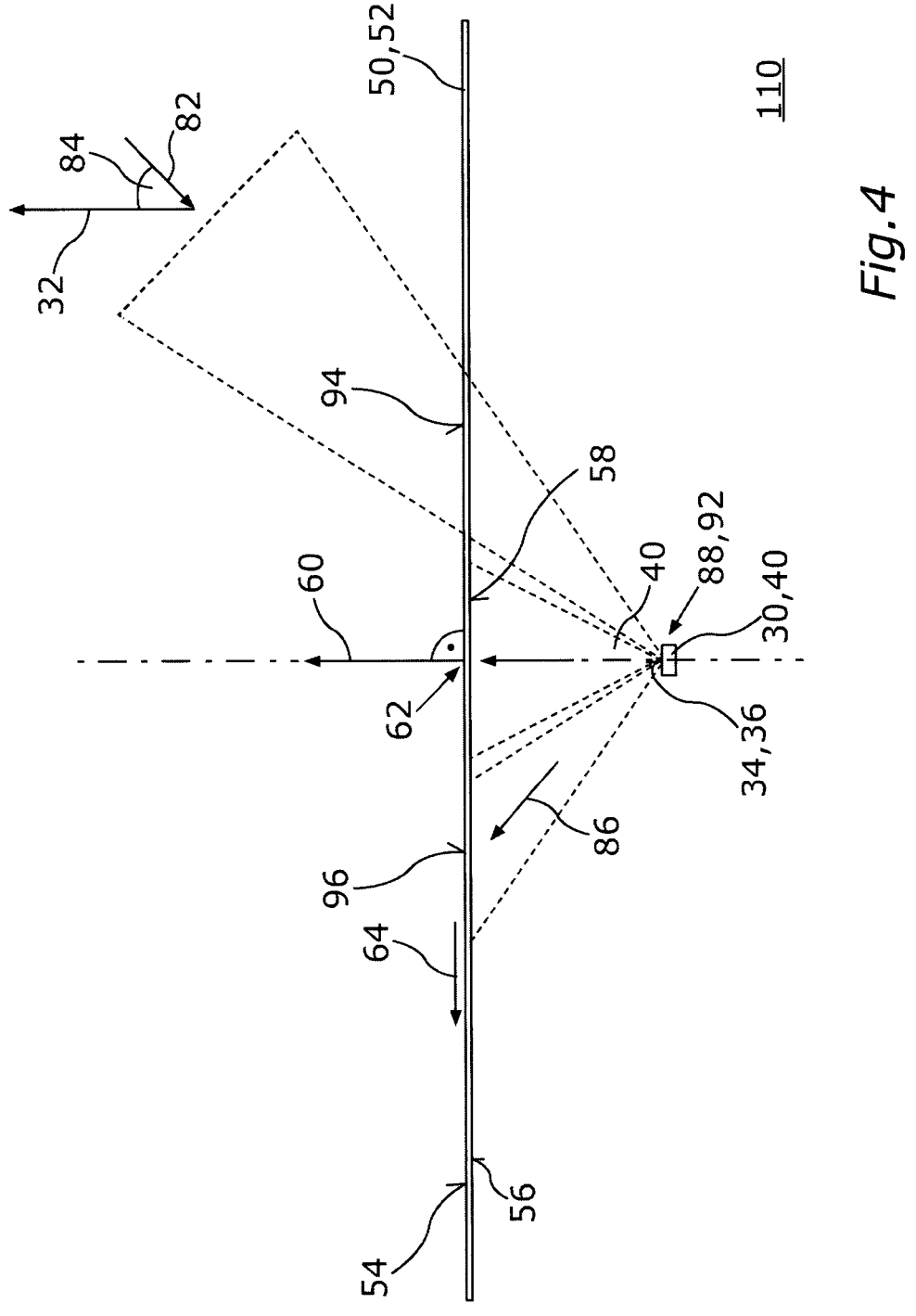
Figure 5:
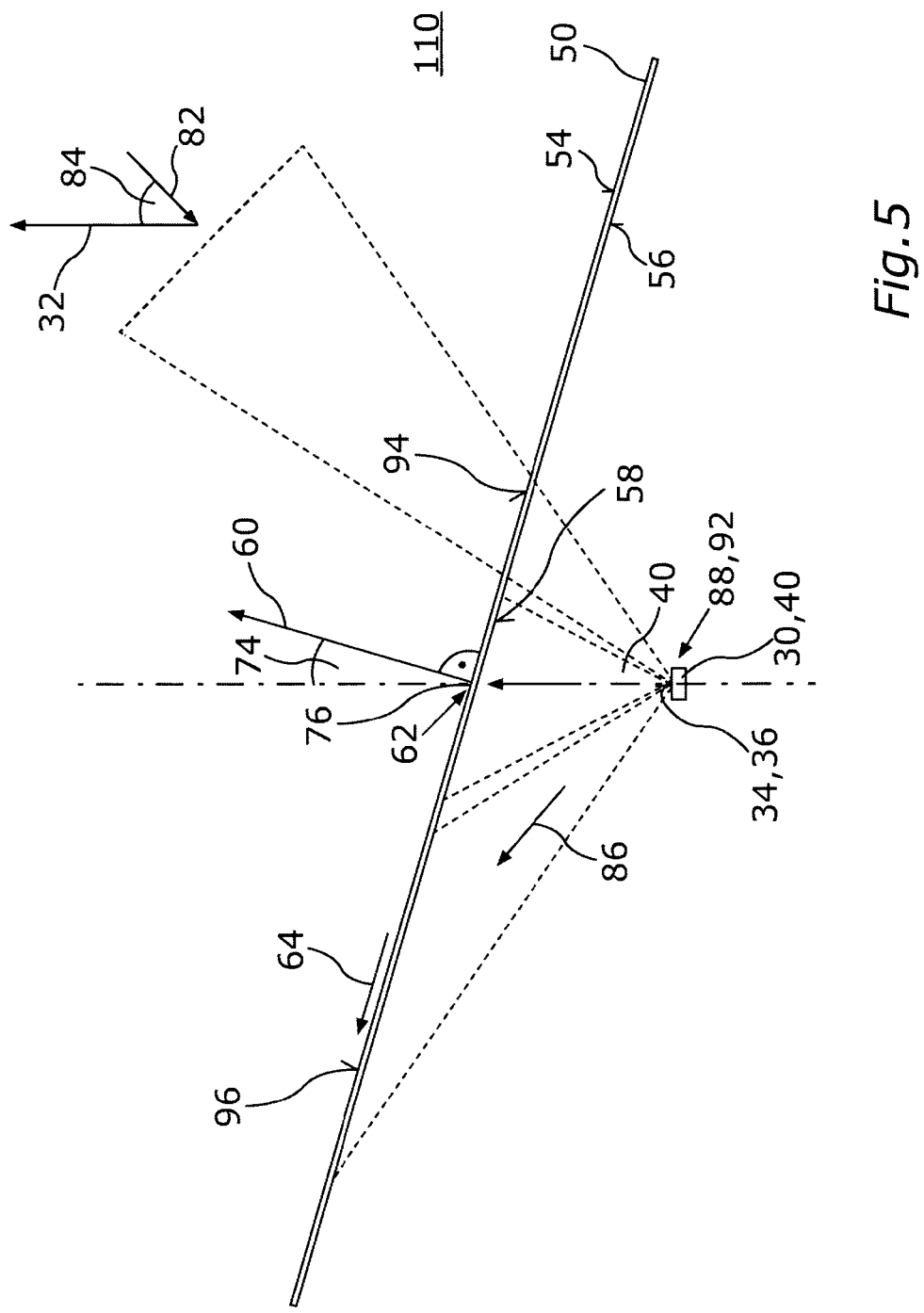
Figure 6:
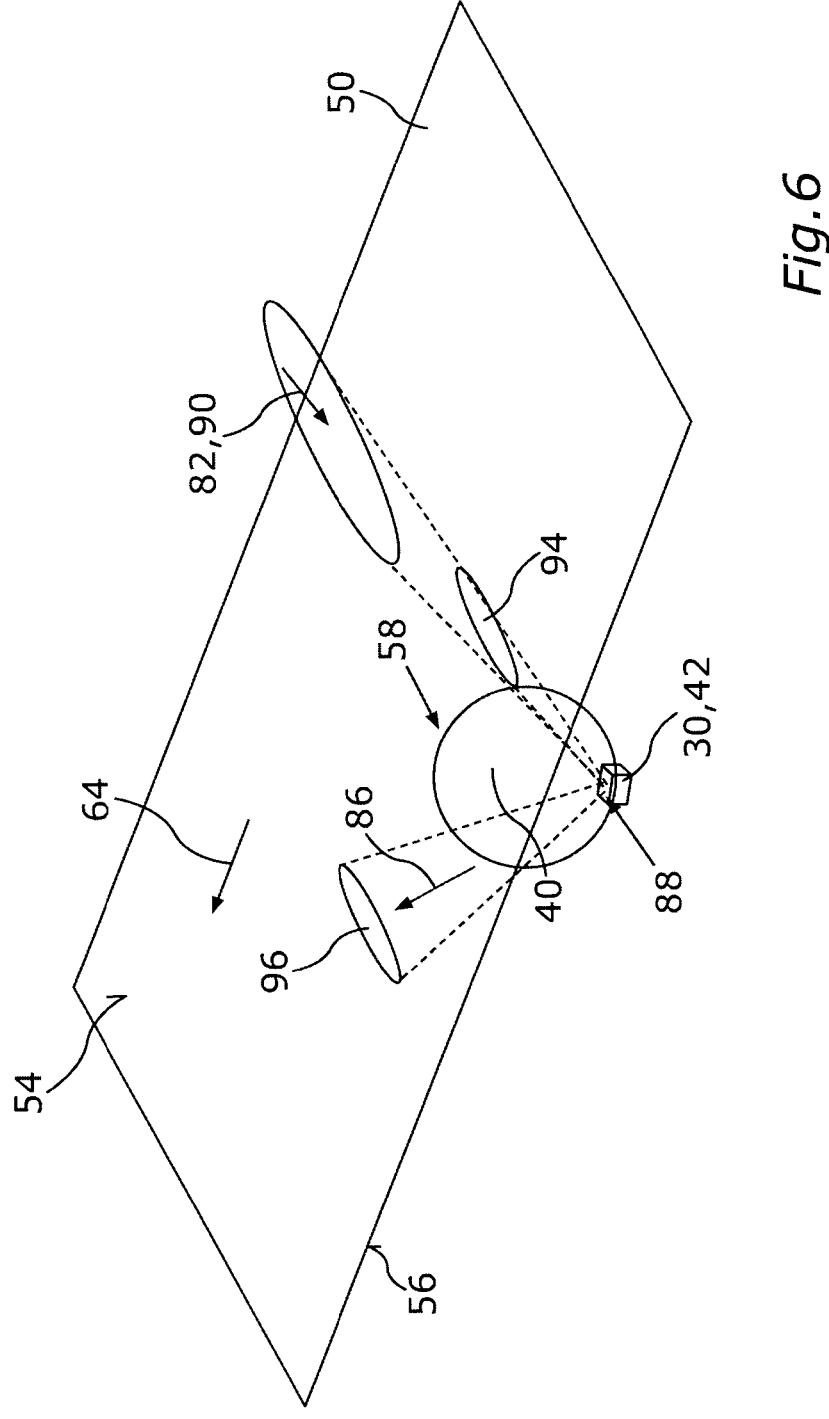
Figure 7:
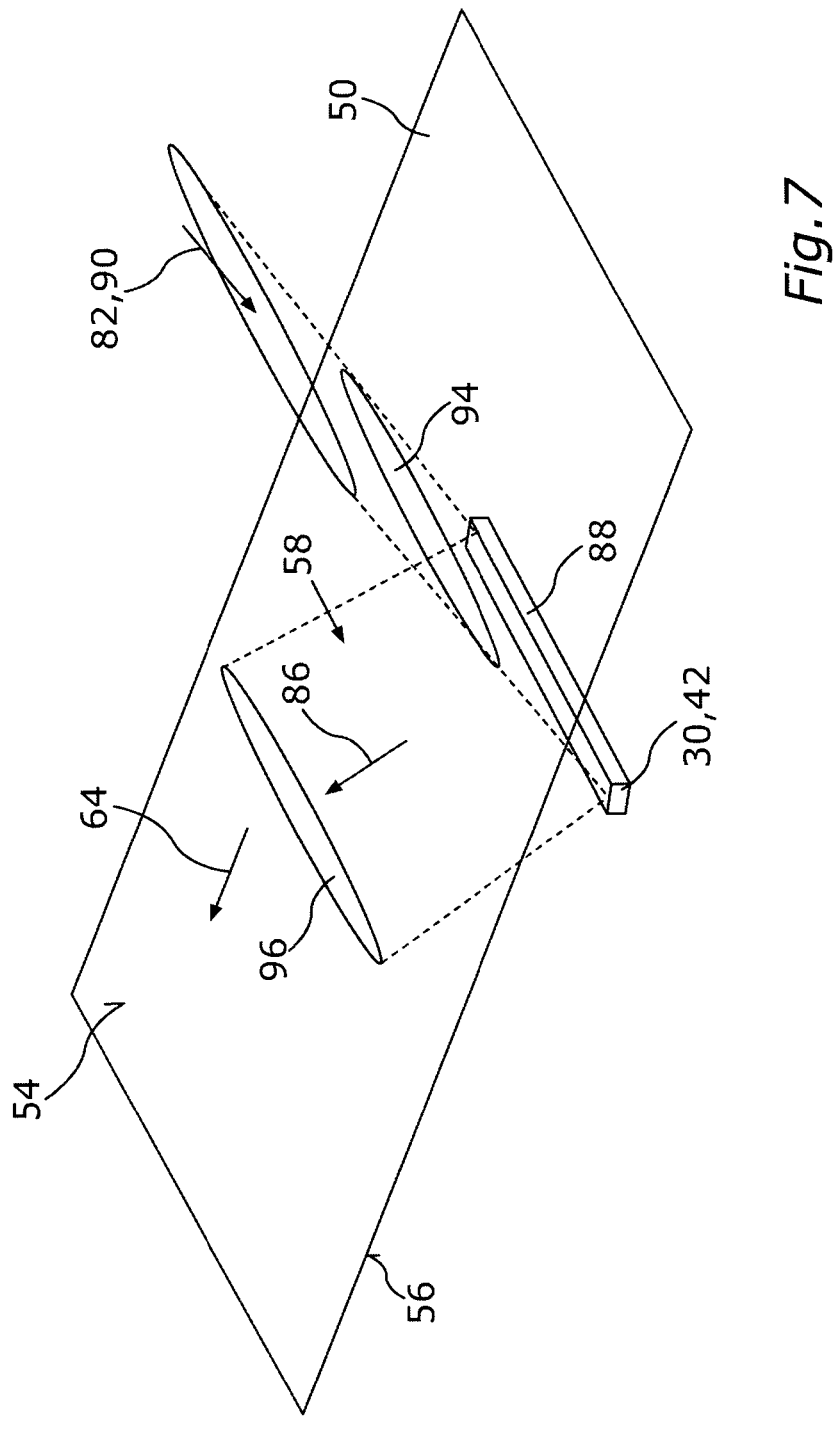
Figure 8:
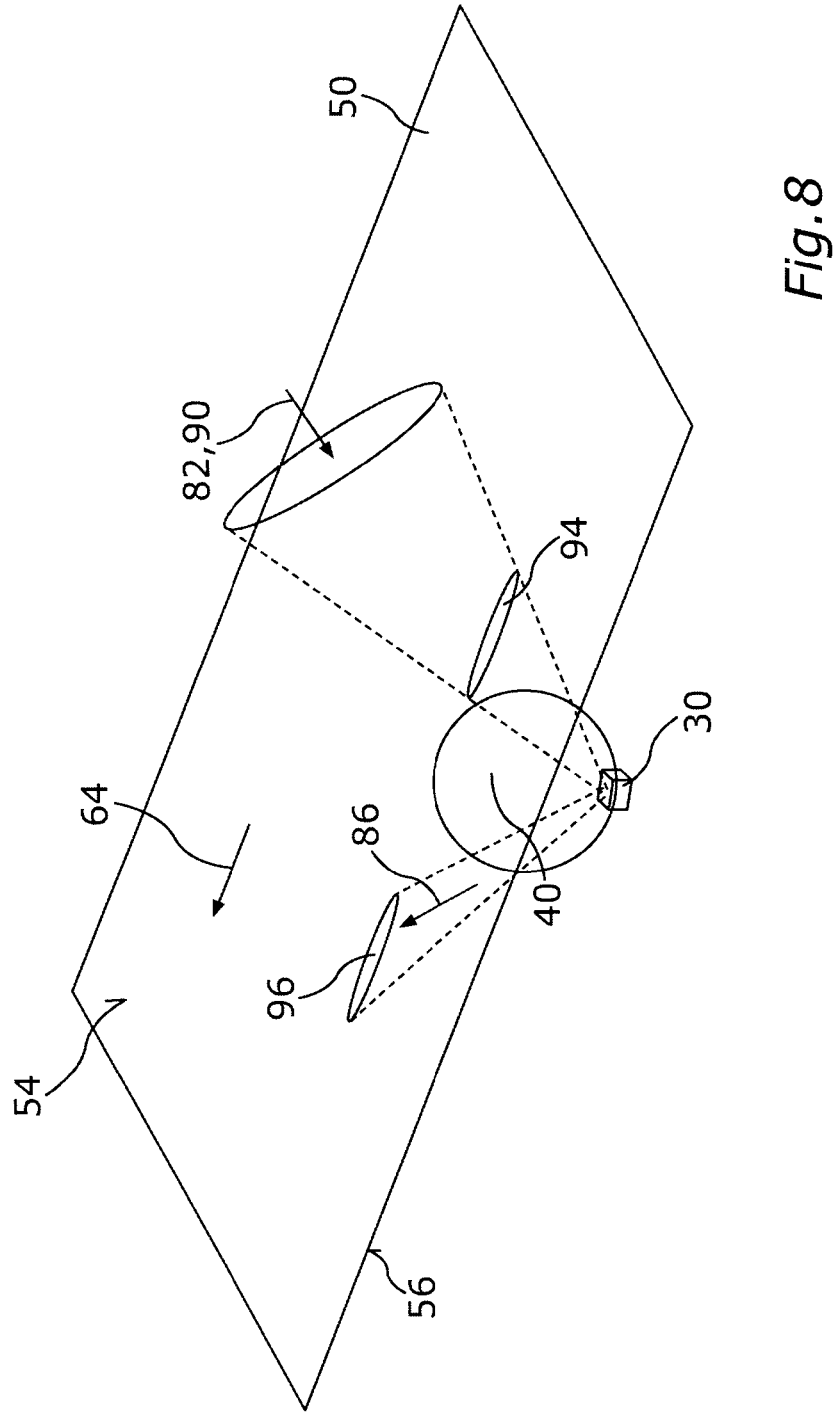
Figure 9:
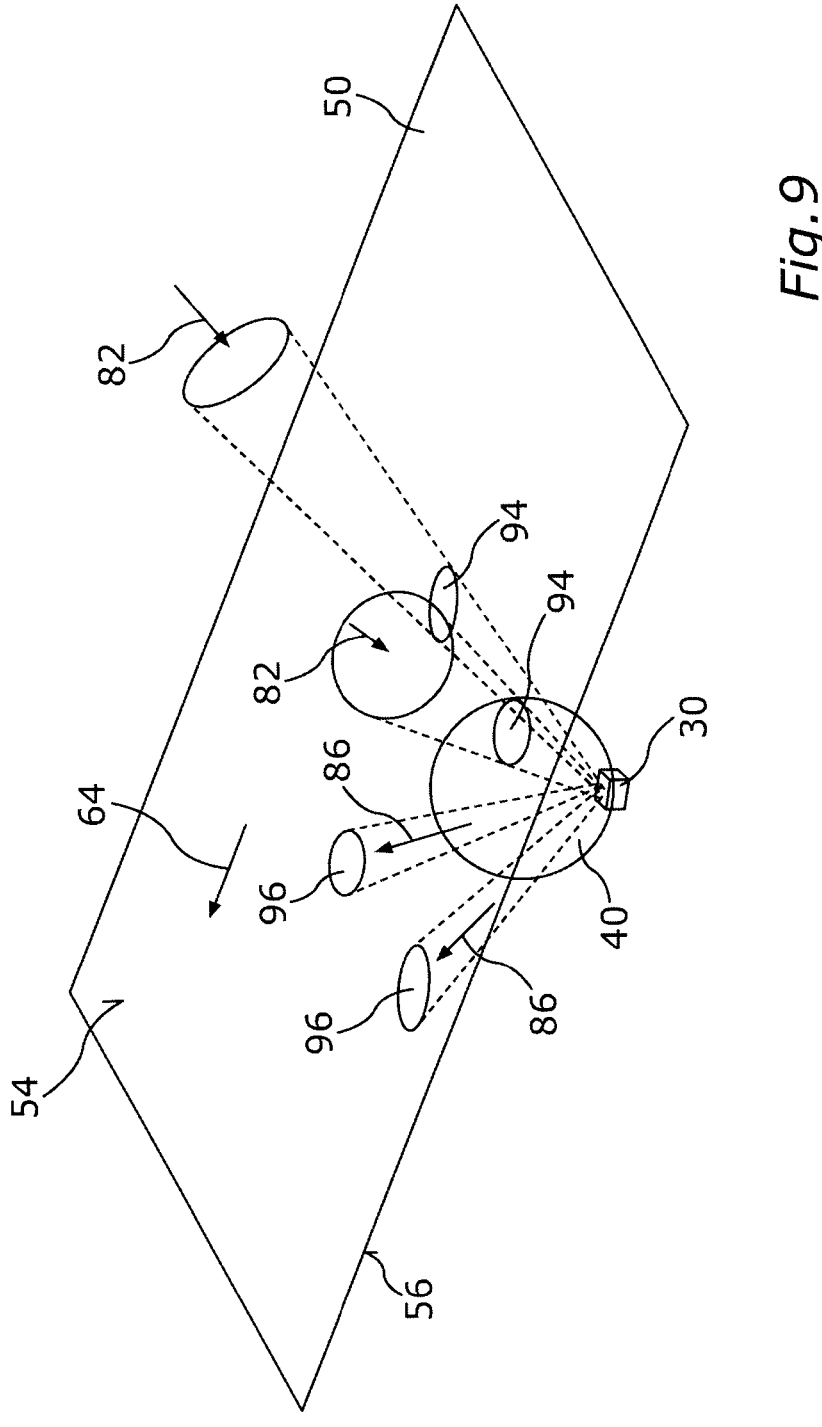
Figure 10:
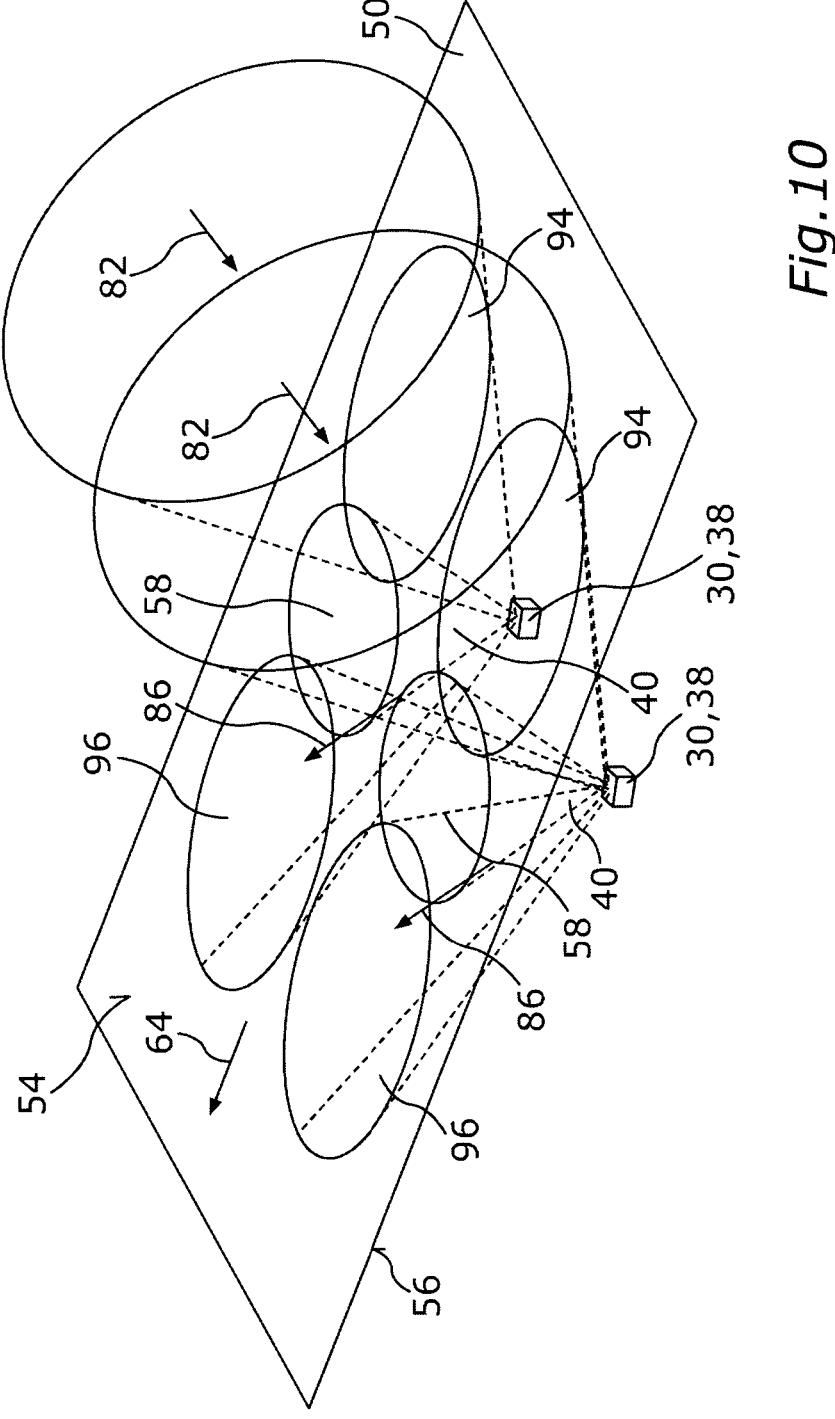
Figure 11:
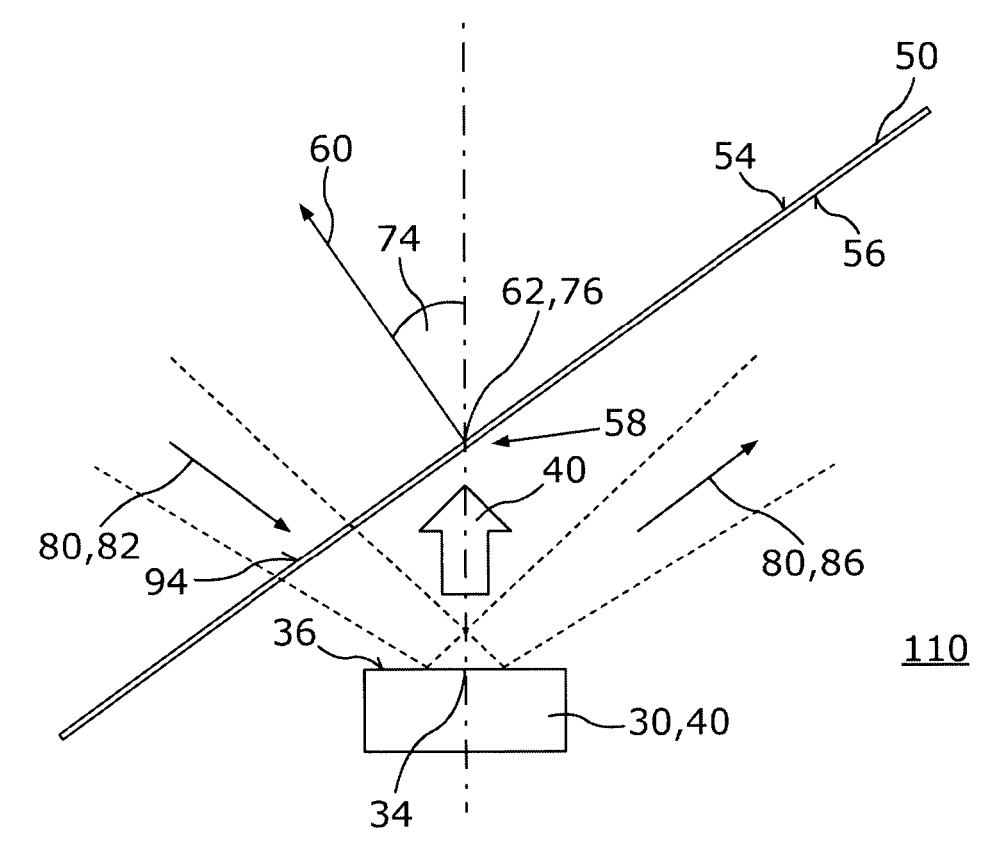
Figure 11:
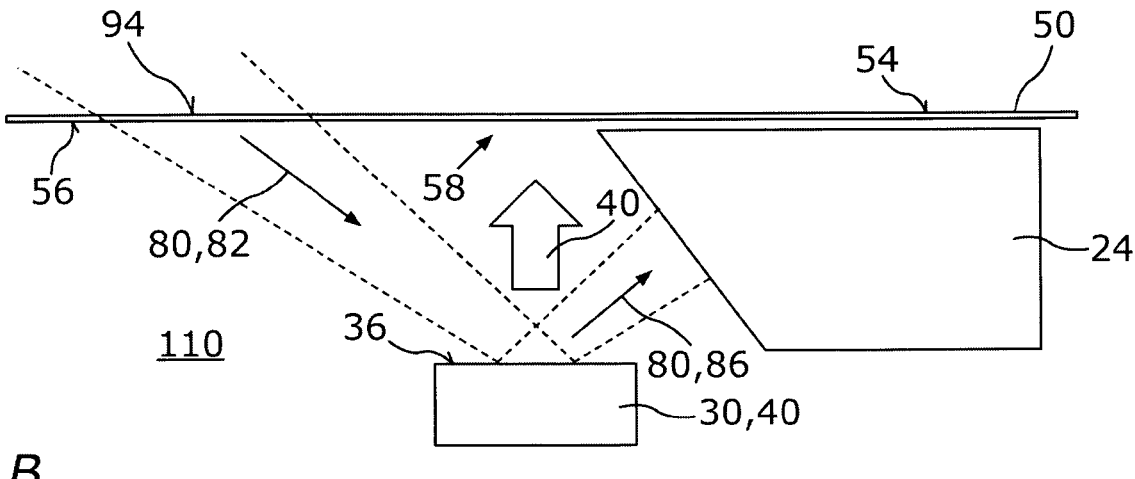
Figure 12:
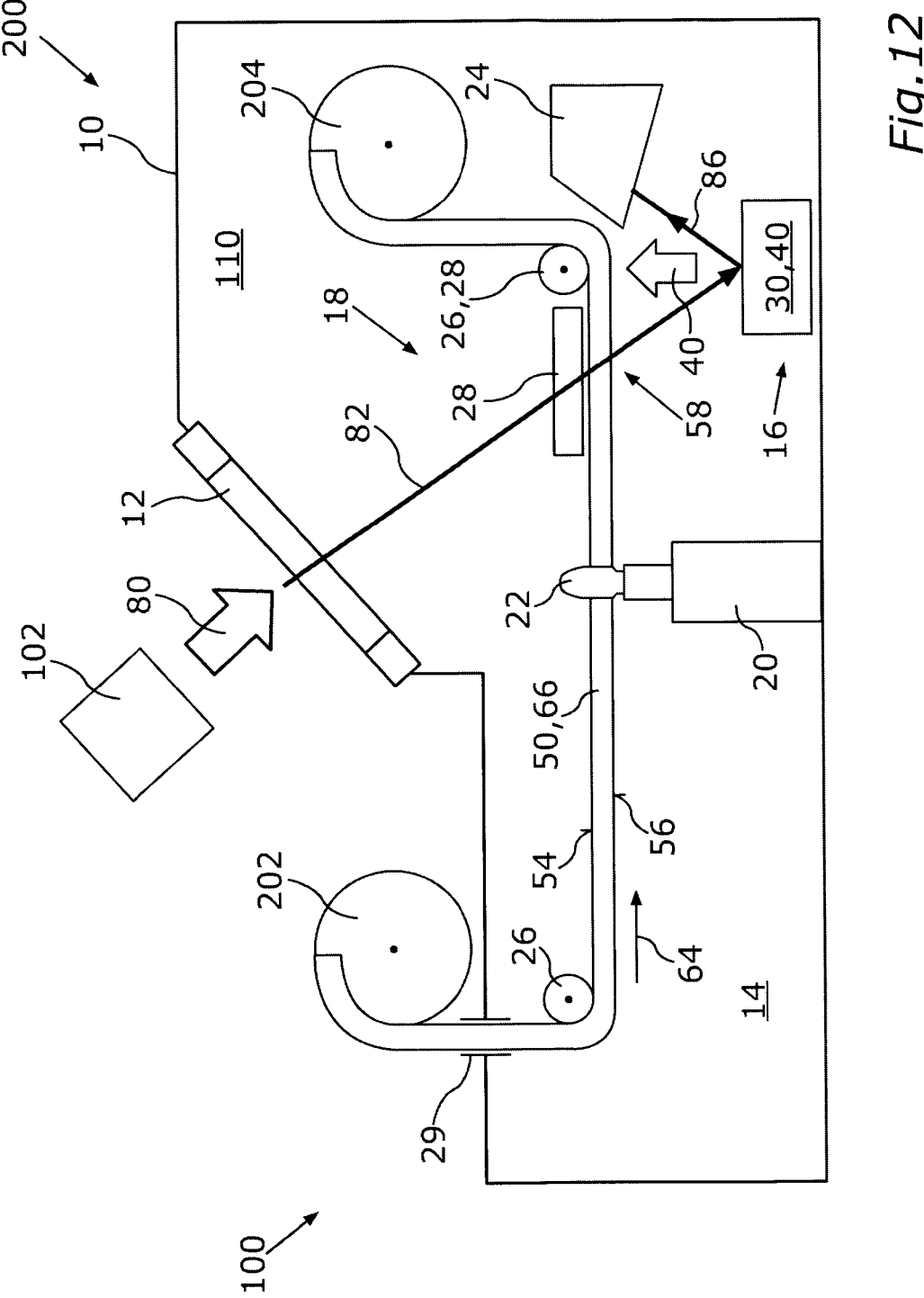
Figure 13:
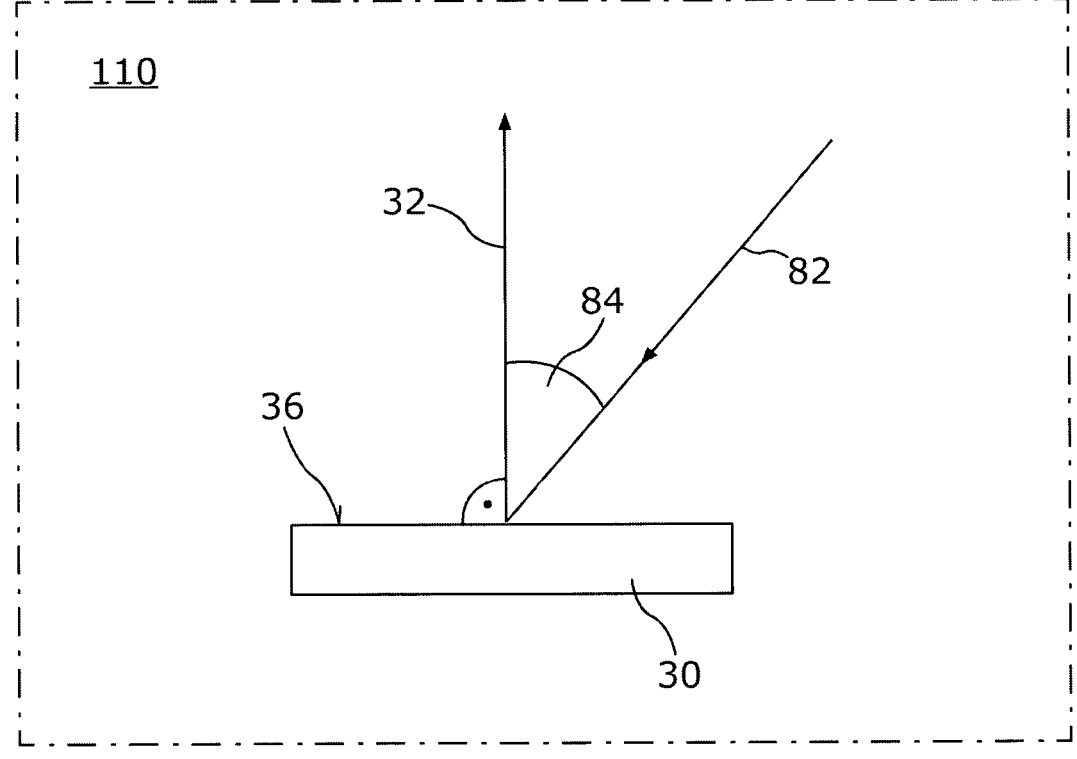

The invention will be explained in detail in the following by means of embodiments and with reference to the drawings in which are shown:

FIG. 1 A thermal evaporation system according to the state of the art,

FIG. 2 A thermal evaporation system according to present invention,

FIG. 3 An angled view of a first embodiment of a coating process according to the present invention, FIG. 4 A side view of the embodiment of a coating process of FIG. 3, FIG. 5 A side view of a second embodiment of a coating process according to the present invention, FIG. 6 An angled view of a third embodiment of a coating process according to the present invention, FIG. 7 An angled view of a fourth embodiment of a coating process according to the present invention, FIG. 8 An angled view of a fifth embodiment of a coating process according to the present invention, FIG. 9 An angled view of a sixth embodiment of a coating process according to the present invention, FIG. 10 An angled view of a seventh embodiment of a coating process according to the present invention, FIG. 11 Side views of an eight and a ninth embodiment of a coating process according to the present invention, FIG. 12 Another embodiment of a thermal evaporation system according to present invention, and FIG. 13 A radiation plane as defined in the present invention.

In FIG. 2, a simplified thermal evaporation system 200 according to the present invention is depicted. Similar to the system 200 of the state of the art depicted in FIG. 1, also the system 200 according to the present invention is based on sublimating and/or evaporating source material 40 by impinging electromagnetic radiation 80 on a source 30 providing the source material 40. However, as described in the following, the system 200 according to the present invention comprises several differences to the system 200 of the state of the art and is in particular preferably constructed such that it can be used to carry out a method according to the present invention.

The thermal evaporation system 200 depicted in FIG. 2 comprises an apparatus 100, an electromagnetic radiation source 102 and a means for providing a reaction atmosphere 14, which is not shown. A source arrangement 16 comprising the source 30 and a substrate arrangement 18 comprising the substrate 50 are arranged within a reaction chamber 10 of the apparatus 100, which additionally is filled with a reaction atmosphere 14.

The reaction atmosphere 14 can be a vacuum between $10^{-4}$ and $10^{-12}$ hPa, for pure ideal conditions $10^{-8}$ hPa to $10^{-12}$ hPa, or can comprise or consist of one or more reaction gases such as for instance molecular oxygen, ozone, molecular hydrogen or molecular nitrogen, with a pressure of $10^{-8}$ hPa to ambient pressure, preferably up to 1 hPa. In the latter case, the reaction gases can preferably be chosen according to the composition of the coating. The oxygen variants $O_2$ and $O_3$ are can preferably be provided in a ratio of approximately 9:1 as produced by an inline glow discharge ozone generator. Further, the reaction gas can be at least ionized, in particular ionized by plasma ionization.

For example, for depositing an oxide of a metal onto the substrate 50, oxygen and/or ozone can be chosen as reaction gas for the reaction atmosphere 14 and the respective metal can be provided as source material 40 evaporated and/or sublimated during the coating process. The respective oxide is formed by a reaction of the evaporated and/or sublimated metal with the oxygen atoms provided by the reaction atmosphere 14.

Electromagnetic radiation 80, preferably laser light 80, in particular laser light 80 with a wavelength between 10 nm and 100 μm, preferably with a wavelength selected in the infrared range, especially with a wavelength of 1 μm, provided by the electromagnetic radiation source 102 is coupled into the reaction chamber 10 through a chamber window 12 and used as incident radiation beam 82 for evaporating and/or sublimating the source material 40 for coating a coating region 58 (see FIGS. 3 to 12) on a front surface 56 of the substrate 50. The electromagnetic radiation 80 is focused towards the source 30, preferably and as depicted in FIG. 2 such that a focal volume 88 of the incident radiation beam 82 is arranged at or near the surface 36 of the source 30.

In addition, the incident radiation beam 82 and a normal 32 of the surface 36 of the source 30 include an incident angle 84 between 20° and 70°, preferably an incident angle 84 (see FIG. 4, 5, 11) between 35° and 55°. In addition, said normal 32 and the incident radiation beam 82 form and define a radiation plane 110. In particular, in FIG. 2 shows the thermal evaporation system 200 in a side view and the section plane is formed by the radiation plane 110. An explanatory representation of the definition of the radiation plane 110 is depicted in FIG. 13.

Essential to the present invention, both for the method and the apparatus 100, the substrate 50 is arranged in step b) of the method according to the present invention between the chamber window 12 and the source 40. In other words, the substrate 50 is arranged in the direct line of sight between the chamber window 12 and the source 40. To prevent masking the source 40, the substrate material 52 is provided in step a) of the method according to the present invention such that it is transparent or at least essentially transparent to the electromagnetic radiation 80.

Hence, during the coating process the electromagnetic radiation 80 shines through the substrate 50 before imping- ing onto the surface 36 of the source 30 and hence illumi- nating the source 30 in step c) according to the present invention. As a result, evaporated and/or sublimated source material 40, depicted as arrows 40 in FIG. 2, is deposited onto the front surface 56 of the substrate 50 and cannot reach the chamber window 12. As a deposition of evaporated and/or sublimated source material 40 onto the chamber window 12 has a crucial impact onto the service life of the evaporation system 200 as a whole, said service life can be drastically prolonged. Preferably, a replacement of the chamber window 12 due to coating with the evaporated and/or sublimated source material 40 can be completely prohibited.

In the embodiment depicted in FIG. 2, the substrate 50 comprises four substrate segments 70 arranged back to back and connected by substrate connectors 72. Each substrate segment 70, and hence the substrate 50 as a whole, is planar. Due to this also the coating region 58 is planar and can be arranged in a plane perpendicular to the radiation plane 110.

Further, the whole substrate 50 is moved by an actuator 22 of the substrate holder 20 along a moving direction 64. As the substrate connectors 72 can be more or less transparent to the impinging electromagnetic radiation 80 compared to the substrate segments 70, the velocity of the movement of the substrate 50 along the moving direction 64 can be accordingly decreased or increased, when the respective substrate connector 72 is illuminated by the electromagnetic radiation 80. Thereby an energy deposition of the electro- magnetic radiation 80 into the source 30 and hence an evaporation and/or sublimation rate of the source material 40 can be kept constant over time. Alternatively, the inten- sity of the electromagnetic radiation 80 may be temporarily increased or decreased to keep the evaporation and/or sub- limation rate of the source material 40 constant over time.

Alternatively, in particular for substrates 50 consisting of a single substrate segment 70, such as for instance flexible foils 66 (see FIG. 12), also a constant velocity of the movement of the substrate 50 along the moving direction 64 is possible. Further, also different moving patterns are pos- sible, for instance a linear, circular, helical or meandering moving pattern. Preferably, the substrate 50 moves at least on average along an intersection line of the substrate 50 and the radiation plane 110 (see FIG. 13).

In the following, several examples of coating processes are depicted in FIGS. 3 to 12. All of these coating processes take place in an apparatus 100 according to the present invention, and a respective thermal evaporation system 200, as shown by way of example in FIG. 2. In the following FIGS. 3 to 10, for the respective coating processes only the essential elements are shown, nevertheless, all other neces- sary elements of the apparatus 100 are still present, despite not being shown.

FIGS. 3 and 4 show a first example of a coating process rendered possible by the method and/or apparatus according to the present invention, depicted in FIG. 3 in an angular view and in FIG. 4 in a side view, respectively. Hence, in the following both FIGS. 3 and 4, respectively, are described together.

In FIG. 3, 4 the basic components for a coating process rendered possible by the present invention are depicted. An incident radiation beam 82 illuminates a source 30 compris- ing a source material 40. The incident radiation beam 82 and a normal 32 at the center 34 of the surface 36 of the source 30 include the aforementioned incident angle 84. The center 34 of the surface 36 of the source 30 should be understood as the center of the intersection area 92 of the incident radiation beam 82 and the surface 36 of the ssource 30.

Essentially for the invention, a substrate 50 providing a coating region 58 is arranged such that the incident radiation beam 82 impinges onto the back surface 54 of the substrate 50 and, following from this, shines through the substrate 50. For this, the substrate material 52 of the substrate 50 is transparent or at least essentially transparent to the incident radiation beam 82. Said positioning of the substrate 50 provides several advantages. In the embodiment depicted in FIG. 3, 4, the substrate is arranged such that it is perpen- dicular to the radiation plane 110 and further that a normal 60 at the center of the coating region 58 is parallel, in particular identical, to a line connecting the center 34 of the surface 36 of the source 30 with the center 62 of the coating region 58.

First of all, as the substrate 50 itself is transparent or at least essentially transparent, constraints concerning the spa- tial arrangement of the source 30, the substrate 50 and/or the incident radiation beam 82 can be avoided or are at least drastically reduced.

Further, evaporated and/or sublimated source material 40 is deposited onto the substrate 50, primarily as desired onto the coating region 58 on the front surface 56 of the substrate 50. However, evaporated and/or sublimated source material 40 also moves towards the chamber window 12 (see FIG. 2) along the line of sight of the incident radiation beam 82. Also, this source material 40 is deposited onto the substrate 50 and hence a deposition of source material 40 onto the chamber window 12 can be prohibited. This results in a drastic extension of the service life of the thermal evapora- tion system 200 (see FIG. 2) as a whole.

In addition, the incident radiation beam 82 is focused towards the source 30. Preferably, as depicted in FIG. 3, 4, the intersection area 92 of the incident radiation beam 82 and the source 30 is formed by a focal point or volume 88 or close to the focal point or volume 88 of the incident radiation beam 82. Resulting from this, a median intersection area 94 of the incident radiation beam 82 and the substrate 50 covers a much bigger area as the intersection area 92 and hence an energy deposit into the substrate 50 by the incident radiation beam 50 can be reduced further.

Further, the incident radiation beam 82 can be reflected on the surface 36 of the source 30 into a reflected radiation beam 86. The reflected radiation beam 86 falls, by definition, into the radiation plane 110 and intersects again with the substrate 50 in an intersection area 96. Especially in embodiments as shown in FIG. 3, 4, in which the substrate 50 is moved along a moving direction 64, the substrate 50 is already coated by at least the source material 40 in the region of the intersection area 96. Hence, and in addition by the fact that the deposited material in the coating region 58 in most of the cases is less transparent than the substrate material 52, an energy deposited by reflected radiation beam 86 onto the substrate 50 and the already deposited source material 40 can perform annealing processes.

The following FIGS. 5 to 12 depict variations of the basic coating process shown in FIGS. 3 and 4. Hence, with respect to said following embodiments above all the differences to the coating process shown in FIG. 3, 4 will be described. With regard to unchanged elements, reference is made to the preceding description of FIGS. 3 and 4.

FIG. 5 shows a second embodiment of a coating process rendered possible by the invention. Although largely the same or at least similar to the embodiment depicted in FIGS. 3 and 4, the present embodiment comprises the main difference that the substrate is tilted around a tilting axis 76 by a tilting angle 74. The tilting angle 74 is included between the normal 60 at the center 62 of the coating region 58 and the line connecting the center 34 of the surface 36 of the source 30 with the center 62 of the coating region 58.

As clearly visible in FIG. 5, by tilting the substrate 50 the sizes of the intersection areas 94, 96 of the incident radiation beam 82 and the reflected radiation beam 86, respectively, can be altered, while simultaneously the size of the coating region 58 is more or less kept constant.

In the embodiment shown in FIG. 5, the intersection area 96 of the reflected radiation beam 86 and the substrate 50 is enlarged and hence the energy deposit caused by the reflected radiation beam 86 into the substrate 50 and in particular the coating on the front surface 56 of the substrate 50 arranged at said intersection area 96 is reduced. This can be applied for instance to weaken or completely prevent annealing processes. In alternative embodiments, also a tilting of the substrate 50 in the opposite direction is possible, resulting in an increase of the respective energy deposit at the intersection area 96.

FIGS. 6 and 7 show embodiments of the coating process, in which incident radiation beam 82 comprises a beam shape 90 such that an extension of the beam shape 90 perpendicular to the radiation plane 110 is larger than an extension of the beam shape 90 parallel to the radiation plane 110. The two depicted embodiments differ by the source shape 42 of the source 30, wherein in FIG. 6 the source shape 42 is more or less circular and in FIG. 7 the source shape 42 is also enlarged perpendicular to the radiation plane 110.

In both embodiments, the incident radiation beam 82 is focused towards the source 20, consequently in FIG. 6 in a focal point 88 on or near the source surface 36, in FIG. 7 in an elongated and line-shaped focal volume 88 on or near the source surface 36. Hence in both embodiments a focused, high power density illumination of the complete source 30 can be provided.

In the embodiment of FIG. 6, the beam shape 90 entails that the intersection areas 94, 96 with the substrate 50 cover a larger width perpendicular to the radiation plane compared to the respective intersection areas 94, 96 caused by a circular beam shape 90 with the same cross-sectional area.

Hence, a coverage of the coating area 58, in particular by the intersection area 96 of the reflected radiation beam 86, can be improved.

In addition to the aforementioned advantages, in combination with a source 30 with a source shape 42 likewise enlarged perpendicular to the radiation plane 110, as depicted in FIG. 7, an illumination of the source 30 as a whole with the incident radiation beam 82 can be ensured by the aforementioned enlarged extension of the beam shape 90 perpendicular to the radiation plane 110. Hence, the incident radiation beam 82 can evaporate and/or sublimate source material 40 from the source 30 for a deposition across the entire width of the coating area 58.

Additionally, or alternatively, in another possible embodiment shown in FIG. 8, the incident radiation beam 82 comprises a beam shape 90 such that an extension of the beam shape 90 perpendicular to the radiation plane 110 is smaller than an extension of the beam shape 90 parallel to the radiation plane 110. In other words, only a small part of the possible width of the coating region 58 is covered by the intersection area 94, 96 of the incident radiation beam 82 and the reflected radiation beam 86, respectively. In many applications, such as for instance solar cells, the final device has non-active areas such as contact stripes. By providing the incident radiation beam 82, and by that also the reflected radiation beam 86, with the aforementioned beam shape 90, it is possible to localize the intersection areas 94, 96 at these regions not used by the functional film deposited onto the coating region 58.

FIG. 9 shows a further embodiment of a coating process provided by the present invention. As a difference to the embodiments described above, two separate incident radiation beams 82 are used, both of them focused onto the same source 30. By this, the energy density of the intersection areas 94, 96 of both the incident radiation beams 82 and the reflected radiation beams 86, respectively, can be reduced. The need of large intersection areas 94, 96, for instance for spreading the energy deposit into the substrate 50 and/or material deposited onto the coating region 58, may collide with limitations to the available solid angles within the reaction chamber 10. The usage of two or more incident radiation beams 82 can provide a solution to this contending boundary conditions.

Both incident radiation beams 82 define their own radiation planes 110 (in FIG. 9 not explicitly referenced). As clearly visible, each radiation plane 110 in this geometry is rotated around a direction within the radiation plane 110 with respect to the transport direction 64 and in general with respect to the elongated shape of the substrate 50. With a high enough value of said rotation angle and/or a low enough incidence angle 84 (see FIG. 13) of the respective incident radiation beam 82, the intersection area 96 of the reflected radiation beam 86 can be moved outside the area of the substrate 50, allowing the reflected radiation beam 86 to miss the substrate and/or to be absorbed not by the substrate 50, but by a separate, stationary absorber element 24 (not shown) next to the substrate 50 to avoid or strongly reduce the interaction of the reflected radiation beam 86 with the front surface 56 of the substrate 50 and thereby with the source material 40 deposited at the coating region 58.

Similar results as providable with a source 30 comprising a line-like source shape 42 as depicted in FIG. 7 can be provided with a source 30 comprising two or more, in particular disjunct, source sections 38, as shown in FIG. 10, each one of them consisting of the source material 40. In FIG. 10, each one of the source sections 38 is illuminated by a separate incident radiation beam 82. However, also a single incident radiation beam 82 with an enlarged or split extent covering both source sections 38 is possible. Such separate incident radiation beams 82 can also originate from a single electromagnetic radiation source 102 (see FIG. 2) which has been split into several incident radiation beams 82 by mirrors, beam splitters or similar optical devices.

The evaporated and/or sublimated source material 40 of the two individual source sections 38 merge for the coating of the coating region 58. Hence, if both source sections 38 comprise the same source material 40, the deposition of the source material 40 onto the coating region 58 on the front surface 56 of the substrate 50 can be accelerated and/or the size of the said coating region 58 can be enlarged and/or the shape of said coating region 58 can be altered. In particular the deposited film thickness uniformity, in particular in the direction normal to the moving direction 64 along the substrate front surface 56, can be improved.

Alternatively, the source materials 40 of the source sections 38 can also be different. As described above, the evaporated and/or sublimated source materials 40 of the source sections 38 merge during the coating process and are deposited together onto the coating region 58. Hence by providing different source materials 40, the different materials 40 are deposited together onto the coating region 58 on the front surface 56 of the substrate 50. A deposition of alloys and/or chemical compounds comprising or consisting of the different source materials 40, if applicable also comprising atoms of a reaction gas of the reaction atmosphere 14, can thereby be provided.

In particular, the reaction of the one or more evaporated and/or sublimated different source materials 40 may result in a change of the reaction product with respect to its transparency with respect to the electromagnetic radiation 80. Preferably, this change is an increase in transparency, such that the reaction product deposited on the substrate 50 is more transparent to the electromagnetic radiation 80 than the respective source materials 40. In this way, the absorption of electromagnetic radiation 80 transmitted through the substrate 50 by the deposited film may be reduced, thereby reducing or even avoiding the necessity to move the substrate 50 such that a region of sufficient transparency in the substrate 50 is continuously made available to the electromagnetic radiation 80 transmitted through the substrate 50 and the deposited film.

As mentioned above with respect to FIGS. 3 to 10, the incident radiation beam 82 can be reflected on the surface 36 of the source 30 into a reflected radiation beam 86 back onto the front surface 56 of the substrate 50. However, in some of the embodiments of coating processes provided by the present invention, an impinging of the reflected radiation beam 86 onto already coated sections of the front surface 56 would be counterproductive. However, FIG. 11 depicts two possible solutions marked with "A" and "B" provided by the present invention for preventing said back reflection of the electromagnetic radiation 80 onto the front surface 56. The solution "A" shown in the upper half of FIG. 11 is based on tilting the substrate 50 with respect to the source 30 away from the reflected radiation beam 86 of electromagnetic radiation 80 with a tilting angle 74 larger than 0° around a tilting axis 76 perpendicular to the radiation plane 110. Again, the tilting angle 74 is included between a normal 60 at the center 62 of the coating region 76 and a line connecting the center 34 of the surface 36 of the source 30 with the center 62 of the coating region 76. In particular, the included tilting angle 74 is chosen such that the one or more reflected radiation beams 86 miss the front surface 56 of the substrate 50. With this arrangement of the substrate 50, impinging of the reflected radiation beam 86 onto the front surface 56 can be prohibited. Damaging effects for the coating of the substrate 50 caused by the reflected radiation beam 86 can thereby be avoided.

As depicted in the lower half of FIG. 11 as solution "B", also a suitably positioned absorber element 24 can be used for absorbing the reflected radiation beam 86 before it impinges onto the front surface 56 of the substrate 50. Said absorber element 24 is positioned in the path of the reflected radiation beam 86 and hence absorbs the reflected radiation beams 86. Due to that, any damaging effects for the coating of the substrate 50 caused by the reflected radiation beam 86 can be prevented.

The solution described in the previous paragraph is preferred in particular for embodiments of the method according to the present invention, for which spatial constraints and/or features of the substrate 50 itself prohibit the aforementioned tilting of the substrate 50 away from the reflected radiation beam 86. However, said absorber element 24 can also be used in addition to the aforementioned tilting of the substrate 50.

FIG. 12 depicts another possible embodiment of an evaporation system 200 according to the present invention. It shares some features with the embodiment shown in FIG. 2, to whose corresponding description above is hereby referred. In particular, also the system 200 of FIG. 12 comprises an apparatus 100, an electromagnetic radiation source 102 and a reaction chamber 10 filled with a reaction atmosphere 14. A source arrangement 16 comprising the source 30 is arranged within a reaction chamber 10 of the apparatus 100, which additionally is filled with a reaction atmosphere 14.

Again, electromagnetic radiation 80, preferably laser light 80, provided by the electromagnetic radiation source 102 is coupled into the reaction chamber 10 through a chamber window 12 and used as incident radiation beam 82 for evaporating and/or sublimating the source material 40 for coating a coating region 58 on a front surface 56 of the substrate 50. The electromagnetic radiation 80 is focused towards the source 30.

As major difference, in the system 200 of FIG. 12 the substrate 50 is provided as flexible foil 66. The foil 66 is provided by a supply roll 202, moved by the actuator 22 of the substrate holder 20 through the reaction chamber 10, is on its way coated at the coating region 58 and afterwards rolled up a product roll 204. Providing a flexible foil 66 as substrate 50 allows to significantly increase the dimensions of the substrate 50, in particular along the moving direction 64.

Support elements 26, as depicted preferably cylindrical rollers, within the reaction chamber 10 support and guide the foil 66. In the depicted embodiment, the supply roll 202 is arranged outside of the reaction chamber 10, the product roll 204 inside of the reaction chamber 10. In other embodiments, this arrangement scheme can be switched or both rolls 202, 204 can be arranged inside or outside, respectively, of the reaction chamber 10. For embodiments with at least one of the rolls 202, 204 outside of the reaction chamber 10, as depicted in FIG. 12, suitable air locks 29 are provided in the chamber wall of the reaction chamber 10.

As depicted, the flexible foil 66 can be provided straight at the coating region 58. Alternatively, also a bent arrangement of the foil 66 at the coating region 58 is possible. Further, also a cooling of the foil 66 can be provided, for instance by actively cooled support elements 26, 28 or designated cooling elements 28 arranged in the vicinity of the foil 66, preferably with cooling surfaces parallel to the foil 66.

In the depicted embodiment, the substrate 50, namely the foil 66, is run around a support element 26 directly after leaving the coating region 58. Hence, the foil 66 is bent away from the reflected radiation beam 86 such as it is not hit by the reflected radiation beam 86. This results in the same effect as described with respect to embodiment "A" of FIG. 11 provided by the suitable tilting of a planar substrate 50.

Further, also an additional absorber element 24 is part of the embodiment of the system 200 shown in FIG. 12. A prevention of impinging of the reflected radiation beam 82 back onto the front surface 56 can thereby be ensured further.

FIG. 13 schematically shows a definition of the radiation plane 110 as referred to in the preceding descriptions of FIGS. 2 to 12. The incident radiation beam 82 and the normal 32 of the surface 36 of the source 30 include an incident angle 84. Hence, said normal 32 and the incident radiation beam 82 span a plane, in particular the radiation plane 110. In FIG. 13, the radiation plane 110 and the plane of projection are identical.

LIST OF REFERENCES

10 Reaction chamber
12 Chamber window
14 Reaction atmosphere
16 Source arrangement
18 Substrate arrangement
20 Substrate holder
22 Actuator
24 Absorber element
26 Support element
28 Cooling element
29 Air lock
30 Source
32 Normal (source)
34 Center (source)
36 Surface
38 Source section
40 Source material
42 Source shape
50 Substrate
52 Substrate material
54 Back surface
56 Front surface
58 Coating region
60 Normal (coating region)
62 Center (coating region)
64 Moving direction
66 Foil
70 Substrate segment
72 Substrate connector
74 Tilting angle
76 Tilting axis
80 Electromagnetic radiation
82 Incident radiation beam
84 Incident angle
86 Reflected radiation beam
88 Focal point/volume
90 Beam shape
92 Intersection area (incident radiation beam and source)
94 Intersection area (incident radiation beam and substrate)

96 Intersection area (reflected radiation beam and substrate)
100 Apparatus
102 Electromagnetic radiation source
110 Radiation plane
200 System
202 Supply roll
204 Product roll

What is claimed is:

1. Method of coating a coating region on a front surface of a substrate with a source material, the method comprising the following steps:

a) Providing the substrate with a substrate material transparent or at least essentially transparent to the electromagnetic radiation, b) Arranging the substrate and a source within a reaction chamber to dispose the substrate between the chamber window and the source, whereby the source comprises one or more source sections consisting of the source material, and whereby the reaction chamber contains a reaction atmosphere, and the front surface of the substrate faces the source and a back surface of the substrate faces the chamber window, c) Illuminating the source with electromagnetic radiation provided as one or more incident radiation beams coupled into the reaction chamber through the chamber window of the reaction chamber and through the substrate during the coating process for thermally evaporating and/or sublimating source material from the source and depositing it onto the substrate;

wherein the one or more incident radiation beams and a normal to the surface of the source include an incident angle larger than 0° and smaller than 90° and thereby form a radiation plane;

wherein the substrate is subdivided into two or more substrate segments, whereby the two substrate segments are arranged back to back connected by a substrate connector, and moved together during the coating process, wherein the substrate connector is less transparent than the substrate material of the adjacent substrate segements with respect to the electro magnetic radiation, and in step c) an intensity of the one or more incident radiation beams is increased during an illumination of the substrate connector by parts of the one or more incident radiation beams, or wherein the substrate connector is more transparent than the substrate material of the adjacent substrate segments with respect to the electromagnetic radiation, and in step c) an intensity of the one or more incident radiation beams is reduced during an illumination of the substrate connector by parts of the one or more incident radiation beams, or wherein the substrate connector is less transparent than the substrate material of the adjacent substrate segments with respect to the electromagnetic radiation, and the velocity of the movement of the substrate is reduced during an illumination of the substrate connector by parts of the one or more incident radiation beams, or wherein the substrate connector is more transparent than the substrate material of the adjacent substrate segments with respect to the electromagnetic radiation, and the velocity of the movement of the substrate is increased during an illumination of the substrate connector by parts of the one or more incident radiation beams.

2. Method according to claim 1,
wherein laser light is used as electromagnetic radiation.
3. Method according to claim 1,
wherein the one or more incident radiation beams are focused towards the source such that a median intersection area of the one or more incident radiation beams with the substrate is larger than an intersection area of the one or more incident radiation beams and the surface of the source.
4. Method according to claim 3,
wherein a focal point or a focal volume of the focused one or more incident radiation beams is arranged at the surface of the source.
5. Method according to claim 1,
wherein the coating region is at least on average arranged in a plane perpendicular to the radiation plane.
6. Method according to claim 5,
wherein at least the coating region of the substrate is planar.
7. Method according to claim 1,
wherein the one or more incident radiation beams and the surface normal to the source include an incident angle between 20° and 70°.
8. Method according to claim 1,
wherein the one or more incident radiation beams are reflected on the surface of the one or more source sections back in one or more reflected radiation beams, in particular onto the front surface of the substrate, whereby the one or more reflected radiation beams fall into the radiation plane.
9. Method according to claim 8,
wherein the substrate is tilted with respect to the source at a tilting angle larger than 0° around a tilting axis perpendicular to the radiation plane, whereby the tilting angle is included between a normal at the center of the coating region and a line connecting the center of the surface of the source with the center of the coating region, whereby the included tilting angle is chosen such that a distance of a median intersection area of the one or more incident radiation beams with the substrate and the source is larger than a distance of a median intersection area of the one or more reflected radiation beams with the substrate and the source.
10. Method according to claim 8,
wherein the substrate is tilted with respect to the source at a tilting angle larger than 0° around a tilting axis perpendicular to the radiation plane, whereby the tilting angle is included between a normal at the center of the coating region and a line connecting the center of the surface of the source with the center of the coating region, whereby the included tilting angle is chosen such that a distance of a median intersection area of the one or more incident radiation beams with the substrate and the source is smaller than a distance of a median intersection area of the one or more reflected radiation beams with the substrate and the source.
11. Method according to claim 9,
wherein the tilting angle of the substrate is chosen for adjusting an energy density of the one or more reflected radiation beams at the front surface of the substrate.
12. Method according to claim 8,
wherein the substrate is tilted with respect to the source at a tilting angle larger than 0° around a tilting axis perpendicular to the radiation plane, whereby the tilting angle is included between a normal at the center of the coating region and a line connecting the center of the surface of the source with the center of the coating region, whereby the included tilting angle is chosen such that the one or more reflected radiation beams miss the front surface of the substrate.
13. Method according to claim 8,
wherein an absorber element is arranged between the surface of the one or more source sections and the front surface of the substrate such that the one or more reflected radiation beams impinge onto the absorber element and are absorbed by the absorber element.
14. Method according to claim 1,
wherein the substrate is moved during the coating process for rearranging the substrate with respect to the position of the coating region on the front surface of the substrate, whereby a distance between the source and the coating region is kept constant or at least essentially constant.
15. Method according to claim 14,
wherein the substrate is moved in at least one of the following ways:
linearly
circularly
helically
meanderingly.
16. Method according to claim 14,
wherein the substrate is at least on average moved along an intersection line of the substrate and the radiation plane.
17. Method according to claim 14,
wherein the substrate is moved at constant velocity.
18. Method according to claim 1,
wherein the substrate is provided as a flexible foil supported by support elements, in within the reaction chamber.
19. Method according to claim 1,
wherein the source comprises two or more source sections, each one of the source sections consisting of the source material.
20. Method according to claim 19,
wherein the source materials of two or more of the source sections are different.
21. Method according to claim 1,
wherein one or more of the source sections comprises a source shape such that an extension of the source shape perpendicular to the radiation plane is larger than an extension of the source shape parallel to the radiation plane.
22. Method according to claim 1,
wherein the one or more incident radiation beams comprise a beam shape such that an extension of the beam shape perpendicular to the radiation plane is larger than an extension of the beam shape parallel to the radiation plane.
23. Method according to claim 1,
wherein the one or more incident radiation beams comprise a beam shape such that an extension of the beam shape perpendicular to the radiation plane is smaller than an extension of the beam shape parallel to the radiation plane.
24. Method according to claim 1,
wherein the electromagnetic radiation is provided as two or more incident radiation beams, whereby each one of the two or more incident radiation beams illuminates the source through the substrate during the coating process.

* * * * *